United States Patent
Fayneh et al.

(10) Patent No.: US 10,740,262 B2
(45) Date of Patent: Aug. 11, 2020

(54) INTEGRATED CIRCUIT I/O INTEGRITY AND DEGRADATION MONITORING

(71) Applicant: PROTEANTECS LTD., Haifa (IL)

(72) Inventors: Eyal Fayneh, Givatayim (IL); Evelyn Landman, Haifa (IL); Shai Cohen, Haifa (IL); Guy Redler, Haifa (IL); Inbar Weintrob, Givat-Ada (IL)

(73) Assignee: PROTEANTECS LTD., Haifa (IL)

( * ) Notice: Subject to any disclaimer, the term of this patent is extended or adjusted under 35 U.S.C. 154(b) by 0 days.

(21) Appl. No.: 16/729,680

(22) Filed: Dec. 30, 2019

(65) Prior Publication Data
US 2020/0210354 A1 Jul. 2, 2020

Related U.S. Application Data

(60) Provisional application No. 62/786,460, filed on Dec. 30, 2018.

(51) Int. Cl.
*G06F 3/00* (2006.01)
*G06F 13/16* (2006.01)
(Continued)

(52) U.S. Cl.
CPC .......... *G06F 13/1673* (2013.01); *H01L 24/16* (2013.01); *H01L 25/0655* (2013.01);
(Continued)

(58) Field of Classification Search
CPC . G06F 13/1673; H01L 25/0655; H01L 25/18; H01L 24/16; H01L 2924/1431;
(Continued)

(56) References Cited

U.S. PATENT DOCUMENTS 5,818,251 A  10/1998  Intrater
6,683,484 B1  1/2004  Kueng et al.
(Continued)

FOREIGN PATENT DOCUMENTS

| CN | 108534866 A | * | 9/2018 |
| WO | 2019102467 A1 | | 5/2019 |
| WO | 2019202595 A1 | | 10/2019 |

OTHER PUBLICATIONS

James P. Hofmeister, et al, "Ball Grid Array (BGA) Solder Joint Intermittency Detection: SJ BIST™", IEEE Aerospace Conference Proceedings, Apr. 2008, paper #1148, Version 1.
(Continued)

*Primary Examiner* — Jing-Yih Shyu
(74) *Attorney, Agent, or Firm* — The Roy Gross Law Firm, LLC; Roy Gross

(57) ABSTRACT

An input/output (I/O) block for a semiconductor integrated circuit (IC), which includes: at least one I/O buffer, configured to define at least one signal path in respect of a connection to a remote I/O block via a communication channel, each signal path causing a respective signal edge slope; and an I/O sensor, coupled to the at least one signal path and configured to generate an output signal indicative of one or both of: (a) a timing difference between the signal edge for a first signal path and the signal edge for a second signal path, and (b) an eye pattern parameter for one or more of the at least one signal path.

21 Claims, 22 Drawing Sheets

(51) Int. Cl.
*H01L 25/065* (2006.01)
*H01L 25/18* (2006.01)
*H01L 23/00* (2006.01)

(52) U.S. Cl.
CPC .... *H01L 25/18* (2013.01); *H01L 2224/16227* (2013.01); *H01L 2924/1431* (2013.01); *H01L 2924/1436* (2013.01); *H01L 2924/15321* (2013.01)

(58) Field of Classification Search
CPC ... H01L 2924/15321; H01L 2924/1436; H01L 2224/16227
See application file for complete search history.

(56) References Cited

U.S. PATENT DOCUMENTS

| | | | |
|---|---|---|---|
| 6,807,503 B2 | 10/2004 | Ye et al. | |
| 7,067,335 B2* | 6/2006 | Weiner | G01N 21/9501 |
| | | | 324/754.21 |
| 7,369,893 B2 | 5/2008 | Gunderson | |
| 7,443,189 B2* | 10/2008 | Ramappa | G01R 31/307 |
| | | | 324/762.01 |
| 7,501,832 B2 | 3/2009 | Spuhler et al. | |
| 8,001,512 B1 | 8/2011 | White et al. | |
| 8,310,265 B2 | 11/2012 | Zjajo et al. | |
| 8,825,158 B2 | 9/2014 | Swerdlow | |
| 9,760,672 B1* | 9/2017 | Taneja | G06F 30/398 |
| 2004/0230385 A1 | 11/2004 | Bechhoefer et al. | |
| 2007/0182456 A1 | 8/2007 | Agarwal et al. | |
| 2008/0074521 A1* | 3/2008 | Olsen | H04N 3/155 |
| | | | 348/300 |
| 2008/0144243 A1 | 6/2008 | Mariani et al. | |
| 2008/0183409 A1 | 7/2008 | Roberts et al. | |
| 2008/0147355 A1 | 8/2008 | Fields et al. | |
| 2011/0187433 A1 | 8/2011 | Baumann et al. | |
| 2011/0315986 A1* | 12/2011 | Kaneda | G01R 31/2884 |
| | | | 257/48 |
| 2012/0025846 A1 | 2/2012 | Minas et al. | |
| 2012/0038388 A1 | 2/2012 | Tseng et al. | |
| 2012/0217976 A1 | 8/2012 | Clarkson | |
| 2016/0203036 A1 | 7/2016 | Mezic et al. | |
| 2017/0038265 A1* | 2/2017 | Abdelmoneum | G01K 15/005 |
| 2017/0364818 A1 | 12/2017 | Wu et al. | |
| 2018/0365974 A1 | 12/2018 | Haas et al. | |

OTHER PUBLICATIONS

Paulheim H, Meusel R. "A decomposition of the outlier detection problem into a set of supervised learning problems", Machine Learning, Sep. 2015, vol. 100 Issue 2, pp. 509-531.

Zhang L, Marron JS, Shen H, Zhu Z., "Singular value decomposition and its visualization", Journal of Computational and Graphical Statistics, Dec. 2007, vol. 6 Issue 4, pp. 833-854.

* cited by examiner

US 10,740,262 B2

INTEGRATED CIRCUIT I/O INTEGRITY AND DEGRADATION MONITORING

CROSS-REFERENCE TO RELATED APPLICATIONS

This application claims priority to U.S. Provisional Patent Application No. 62/786,460, filed Dec. 30, 2018, entitled "Integrated Circuit Pad Failure Detection", the contents of which are incorporated herein by reference in their entirety.

FIELD OF THE INVENTION

The invention relates to the field of integrated circuits.

BACKGROUND OF THE INVENTION

Integrated circuits (ICs) may include analog and digital electronic circuits on a flat semiconductor substrate, such as a silicon wafer. Microscopic transistors are printed onto the substrate using photolithography techniques to produce complex circuits of billions of transistors in a very small area, making modern electronic circuit design using ICs both low cost and high performance. ICs are produced in assembly lines of factories, termed foundries, which have commoditized the production of ICs, such as complementary metal-oxide-semiconductor (CMOS) ICs. Digital ICs contain billions of transistors arranged in functional and/or logical units on the wafer, and are packaged in a metal, plastic, glass, or ceramic casing. The casing, or package, is connected to a circuit board, such as by using solder. Types of packages may include a leadframe (though-hole, surface mount, chip-carrier, and/or the like), pin grid array, chip scale package, ball grid array, and/or the like, to connect between the IC pads and the circuit board. As used herein, the term IC means the integrated circuit including the package.

Hofmeister et al., "Ball Grid Array (BGA) Solder Joint Intermittency Detection: SJ BIST", IN IEEE Aerospace Conference, 2008, discusses a sensing method for detecting faults in solder-joint networks belonging to the input/output (I/O) block of Field Programmable Gate Arrays (FPGAs), especially in Ball Grid Array packages. This involves the attachment of a small capacitor to two unused I/O ports as near as possible to the corner of the package. This approach may be suitable for monitoring special bumps to detect intermittent failure but might be inappropriate for monitoring functional bumps.

The foregoing examples of the related art and limitations related therewith are intended to be illustrative and not exclusive. Other limitations of the related art will become apparent to those of skill in the art upon a reading of the specification and a study of the figures.

SUMMARY OF THE INVENTION

The following embodiments and aspects thereof are described and illustrated in conjunction with systems, tools and methods which are meant to be exemplary and illustrative, not limiting in scope.

There is provided, in accordance with an embodiment, an input/output (I/O) block for a semiconductor integrated circuit (IC), the I/O block comprising: at least one I/O buffer, configured to define at least one signal path in respect of a connection to a remote I/O block via a communication channel, each signal path causing a respective signal edge slope (or shape); and an I/O sensor, coupled to the at least one signal path and configured to generate an output signal indicative of one or both of: (a) a timing difference between the signal edge for a first signal path and the signal edge for a second signal path, and (b) an eye pattern parameter for one or more of the at least one signal path.

In embodiments, the at least one I/O buffer comprises a transmission buffer and the at least one signal path comprises a first signal path coupled to an output of the transmission buffer that is coupled to the communication channel.

In embodiments, the first signal path is further coupled to the remote I/O block via at least one connection bump, the output signal of the I/O sensor being further indicative of a quality of the at least one connection bump.

In embodiments, the at least one signal path comprises: a third signal path coupled to the remote I/O block via a second connection bump; and a fourth signal path, the I/O sensor being coupled to the third and/or fourth signal paths and configured to generate the output signal being further indicative of one or both of: a timing difference between the signal edge for the third signal path and the signal edge for the fourth signal path, such that the output signal of the I/O sensor is indicative of a quality of the first and second connection bumps; and an eye pattern parameter for the third signal path and/or fourth signal path.

In embodiments, the at least one signal path comprises a signal path that is coupled to an input of the transmission buffer and/or a signal path that is coupled to the remote I/O block via an interconnect (such as an interposer or bridge) and a connection bump between the transmission buffer and the interconnect, the output signal of the I/O sensor being further indicative of a quality of the connection bump.

In embodiments, the I/O block further comprises: a differential buffer, configured to output a difference between a differential buffer input signal, received on a path coupled to the communication channel, and a fixed level signal, a signal path of the at least one signal path being coupled to the output of the differential buffer.

In embodiments, the fixed level signal is a voltage fixed at a predetermined proportion of a DC power supply voltage for the IC, optionally wherein the predetermined proportion is dynamically adjusted and/or the predetermined proportion is 75%.

In embodiments, the at least one I/O buffer comprises a reception buffer having an input that is coupled to the communication channel, a signal path of the at least one signal path being coupled to an output of the reception buffer.

In embodiments, the input to the reception buffer is coupled to the remote I/O block via an interconnect (such as an interposer or bridge) and a connection bump between the interconnect and remote I/O block, the output signal of the I/O sensor being further indicative of a quality of the connection bump.

In embodiments, the communication channel is configured to carry a differential signal via two signal lines, a first signal path of the at least one signal path being coupled to a first signal line and a second signal path of the at least one signal path being coupled to a second signal line.

In embodiments, the at least one I/O buffer comprises a transmission buffer configured to provide a differential output via the two signal lines, the first signal path being coupled to a first output of the transmission buffer coupled to the first signal line and the second signal path being coupled to a second output of the transmission buffer coupled to the second signal line.

In embodiments, the first signal line comprises a first interconnect (such as an interposer or bridge) coupled to the transmission buffer via a first near-side connection bump and the second signal line comprises a second interconnect (such as an interposer or bridge) coupled to the transmission buffer via a second near-side connection bump, the output signal of the I/O sensor being further indicative of a quality of the first and second near-side connection bumps.

In embodiments, the first signal line comprises a first interconnect (such as an interposer or bridge) coupled to the remote I/O block via a first far-side connection bump and the second signal line comprises a second interconnect (such as an interposer or bridge) coupled to the remote I/O block via a second far-side connection bump, the output signal of the I/O sensor being further indicative of a quality of the first and second far-side connection bumps.

In embodiments, the I/O sensor comprises: a first input port coupled to a first option for a first signal path; a second input port coupled to a second option for the first signal path; a third input port coupled to a second signal path; and a selector, configured to select the first or second input port in response to a received selection signal, such that the output signal of the I/O sensor is selectively indicative of a timing difference between the signal edge for the second signal path and the signal edge for the either the first option for the first signal path or the second option for the first signal path.

In embodiments, the I/O block further comprises a differential buffer, configured to output a difference between a first signal, received on a signal path coupled to the communication channel, and a second, fixed level signal, the third input port being coupled to the output of the differential buffer.

In embodiments, the least one I/O buffer comprises one or both of: a transmission buffer, the first input port being coupled to an output of the transmission buffer that is coupled to the communication channel; and a reception buffer having an input that is coupled to the communication channel, the second input port being coupled to an output of the reception buffer.

In embodiments, the eye pattern parameter comprises one or more of: eye width; eye height; eye width jitter; and eye height fluctuation.

In embodiments, the output signal comprises a pulse having a width indicative of: a timing difference between the signal edge for the first signal path and the signal edge for the second signal path; or the eye pattern parameter.

In embodiments, the I/O block further comprises: a performance optimizer configured to adjust a parameter of the at least one I/O buffer based on the output signal of the I/O sensor; and/or a repair controller configured to adjust a configuration of the I/O buffer based on the output signal of the I/O sensor.

In embodiments, the repair controller is configured to disable a part or a whole of the IC, in response to the output signal of the I/O sensor and/or to cause a lane remapping of at least part of the IC, in response to the output signal of the I/O sensor and/or adjust a transmission buffer strength within the IC, in response to the output signal of the I/O sensor.

In embodiments, the repair controller is configured to operate at an initial operation of the IC and/or during normal operation of the IC and/or wherein the adjustment is further made based on an instantaneous temperature of the IC and/or voltage of the IC.

In embodiments, the I/O block further comprises: a time-to-digital converter, configured to receive a timing signal derived from the output signal of the I/O sensor and to provide a digital time signal based on the timing signal.

A semiconductor integrated circuit (IC) may be provided, comprising the I/O block as herein described.

In embodiments, the I/O sensor is configured to communicate the output signal externally of the IC.

In embodiments, the semiconductor IC further comprises: a filtered counter block, configured to receive a time signal based on the output signal of the I/O sensor, to compare the received time signal against a threshold and based on the comparison, to identify exceptional or outlier readouts from the I/O sensor.

In embodiments, the filtered counter block is further configured to count the number of normal readouts from the I/O sensor and/or the number of exceptional or outlier readouts from the I/O sensor.

A semiconductor IC system may be provided, comprising the semiconductor IC as herein described. The semiconductor IC may further comprise: an I/O profiling part, configured to generate an I/O profile and/or classification, based on the output signal of the I/O sensor; and/or an Embedded Virtual Scope (EVS) part, further configured to determine and/or characterize a signal amplitude and/or signal slew-rate for a pin of the semiconductor IC based on the output signal of the I/O sensor.

In embodiments, one or more of the at least one signal path is further coupled to the remote I/O block via at least one connection bump and the I/O profile and/or classification is based on a monitoring of the output signal of the I/O sensor over time.

In embodiments, the I/O profiling part is further configured to perform one or more of: compare the I/O profile and/or classification with family data for the semiconductor IC; detect a systematic shift based on the I/O profile and/or classification; and detection of outliers based on tester data.

There is provided, in accordance with an embodiment, a method for monitoring an input/output (I/O) block of a semiconductor integrated circuit (IC), in which the I/O block comprises at least one I/O buffer defining at least one signal path in respect of a connection to a remote I/O block via a communication channel, each signal path causing a respective signal edge slope (or shape), the method comprising: generating, at an I/O sensor, an output signal indicative of one or both of: a timing difference between the signal edge for a first signal path and the signal edge for a second, distinct signal path; and an eye pattern parameter for one or more of the at least one signal path. In such method embodiments, method steps may optionally be provided to include any of the features discussed with reference to the I/O block embodiment.

In embodiments, the method further comprises: adjusting a parameter of the at least one I/O buffer based on the output signal of the I/O sensor; and/or adjusting a configuration of the I/O buffer based on the output signal of the I/O sensor.

In embodiments, the method further comprises one or both of: disabling a part or a whole of the IC, in response to the output signal of the I/O sensor; and causing a lane remapping of at least part of the IC, in response to the output signal of the I/O sensor.

In embodiments, the step of adjusting is further based on an instantaneous temperature of the IC and/or voltage of the IC.

In embodiments, the method further comprises: generating an I/O profile and/or classification, based on the output signal of the I/O sensor.

In embodiments, one or more of the at least one signal path is further coupled to the remote I/O block via at least one connection bump and the I/O profile and/or classification is based on a monitoring of the output signal of the I/O sensor over time.

In embodiments, the method further comprises one or more of: comparing the I/O profile and/or classification with family data for the semiconductor IC; detecting a systematic shift based on the I/O profile and/or classification; and detecting outliers based on tester data.

In embodiments, the method further comprises: comparing a time signal that is based on the output signal of the I/O sensor, against a threshold; and identifying exceptional or outlier readouts from the I/O sensor, based on the comparison.

In embodiments, the method further comprises: counting the number of normal readouts from the I/O sensor and/or the number of exceptional or outlier readouts from the I/O sensor.

In some embodiments, there may considered a computer readable medium, having instructions stored thereupon for carrying out any of the method embodiments disclosed herein, when said instructions are performed by a processor.

In addition to the exemplary aspects and embodiments described above, further aspects and embodiments will become apparent by reference to the figures and by study of the following detailed description. The skilled person will appreciate that combinations and sub-combinations of specific features disclosed herein may also be provided, even if not explicitly described.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

DETAILED DESCRIPTION OF THE INVENTION

Figure 1:
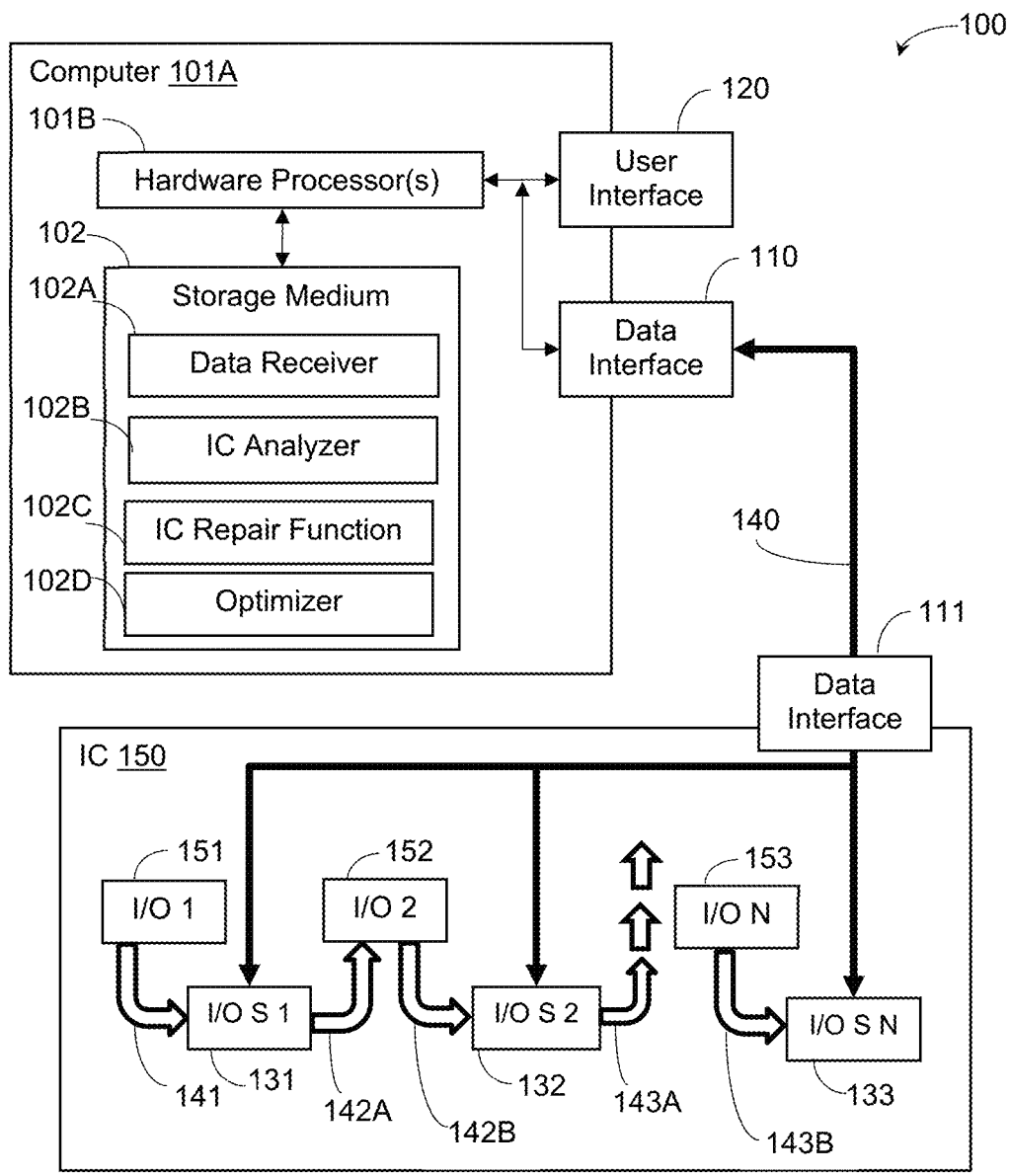
FIG. 1 shows schematically a computerized system for detecting IC pad integrity.

Disclosed herein are devices, systems, and methods to detect input/output (I/O) integrity and/or degradation monitoring and/or to optimize the power/performance for a bump-array. By measuring the timing difference between a signal on a first path to or from an I/O buffer and a signal on a second path to or from an I/O buffer, the integrity and/or degradation can be identified. For example, this may be achieved by comparing the measured timing or slope difference with an expected value, based on calibration data, reference data or historical data for the IC or I/O block. This may allow monitoring of one or more of: bump or microbump resistance integrity or degradation; I/O-buffer degradation at the near-end and/or at the far-end; interconnect/interposer grading, integrity or degradation; integrity or degradation of bi-directional pins or signals; integrity or degradation of unidirectional pins or signals; integrity or degradation of differential pins or signals; intermittent fault detection; different degradation-rate scenarios.

In addition or alternatively, it may further allow I/O profiling and/or classification. Classification or profiling may be understood as a process of binning dies into Si-profiles, where each bin (profile) comprises a cluster of IC-design parameters and resulting device-level-parameters, such as high coverage parameters. During Pre-Si, the IC-design parameters and device-process parameters may be used as an input for the profiling process. During Post-Si, the sensor values and/or certain high coverage measurements may be used as input for the profiling process. In that context, a profile may be considered as a specific cluster of signatures (data) values and distributions that may apply to field performance (specs, defects, etc.) For example, a specific cluster of the manufacture-space (data) values and distributions that may apply to field performance (specs, defects, etc.).

I/O profiling and/or classification may be combined with IC family data, allow systematic shift detection and/or permit detection of outliers based on tester data. An on-chip I/O sensor may be provided for this purpose. A family in this context may refer to a group of ICs classified as having a common parameter that is close in value. For example, this may be a group of physical dies with the same Si-profile/classification. In addition, a family may include a group of Monte-Carlo (MC) samples, for which the simulated IC Design Simulation Values and the Device-Process Simulated Values have the same Si-profile/classification as those of the physical family members. More details about IC family classification are described in co-pending PCT Patent Application Publication No. WO 2019/202595, entitled "Integrated Circuit Profiling and Anomaly Detection", filed Apr. 16, 2019, the contents of which incorporated herein by reference in their entirety.

In embodiments, this may allow optimization of I/O power and/or performance. For example, the power of each transmission (Tx) buffer may be tuned based on desired or needed performance, allowing optimization of the power of the entire array.

In embodiments, an I/O repair function may be provided. For example, this may include disabling part or all of the IC. Another example may comprise lane remapping. A further example comprises adjusting the strength of a transmission buffer (for instance, increase the transmission buffer strength when no lane remapping or repair is possible). Such repair functions may be provided on-tester or in-field. The repair function may be based on the I/O profiling and/or outlier detection processes. Further embodiments may provide I/O-missioning generation.

In embodiments, this may allow optimization of the I/O-buffer (Tx) slew-rate for controlling the amplitude of the current consumption-rate (dI/dT) per buffer and the optimization of the full array in accordance with EMI/RFI (electromagnetic or radio frequency interference) desiderata or needs.

The combination of the on-chip I/O sensor and any ancillary hardware and/or software may be termed an agent. The effect of such agents may allow one or more of: increased yield; power and/or frequency optimization and binning; in-field corrective actions (such as lane repair or remapping, as discussed above); I/O characterization, validation and/or debugging; and increased quality and reliability.

Examples in accordance with the disclosure may be applied to a memory IC, for example High Bandwidth Memory (HBM) or other memories based on Dynamic Random Access Memory (DRAM). Applications to other types of memory or other types of IC are also possible.

Reference is now made to FIG. 1, which shows schematically a computerized system 100 for detecting IC pad integrity. Computerized system 100 comprises an IC 150 with I/O sensors, such as 131, 132, 133, and/or the like, one each electrically connected (141, 42, 143, etc.) measuring the timing delay between signals defined by at least one I/O buffer (151, 52, 153, etc.) connected to an IC pad. In the Near-End case (the I/O-buffer operates in Tx-mode), the timing delay is indicative of a load on the I/O buffer and/or a I/O-buffer strength. In the Far-End case, (the I/O-buffer operates in Rx-mode), the timing delay is indicative of a channel degradation and/or a strength of Tx-buffer at the FE.

In the NE case, the output of the I/O sensor may comprise a pulse, the length of which may be indicative of a change in the I/O buffer load and/or a change in the I/O-buffer strength. In the FE case, the output of the I/O sensor may comprise a pulse, the length of which may be indicative of a change in the channel performance and/or a change in the strength of Tx-buffer at the FE. The I/O sensor may provide an input to a time-to-digital converter (TDC, which optionally may form part of the I/O sensor), such that the output may comprise a digital time measurement value.

The I/O sensor output may be communicated over a data network 140, between a data interface 111 of IC 150 to a data interface 110 of a computer 101A. Computer 101A comprises one or more hardware processors 101B, a user interface 120, and a non-transitory, computer readable storage medium 102. Storage medium 102 has encoded thereon program code modules (102A, 102B, 102C, etc.) that when executed on hardware processor(s) 101B perform actions of a method for measuring and/or controlling the IC, as disclosed herein. Optionally, the I/O output signal is received by a processing component (not shown) on the IC that performs the actions of the method. For example, a Data Receiver 102A receives I/O output signal values. For example, an IC analyzer 102B analyzes the I/O output signal values, for example to determine a baseline behavior of the IC in operation, detect any anomaly such as a bump failure, pad failure, eminent failure, future failure, and/or the like, profile and classify the I/O buffer or the IC, or tune the performance of the IC. The IC analyzer 102B may further provide platform-based analysis and alerts, for example based on machine learning and/or data analytics. An IC Repair Function 102C may then mitigate any predicted or actual failure, for example by one or more of: disabling part or all of the IC; lane remapping within the IC; and adjusting a transmission buffer strength in the IC. An optimizer 102D may perform parameter optimization to improve performance and/or adjust power.

Figure 2:
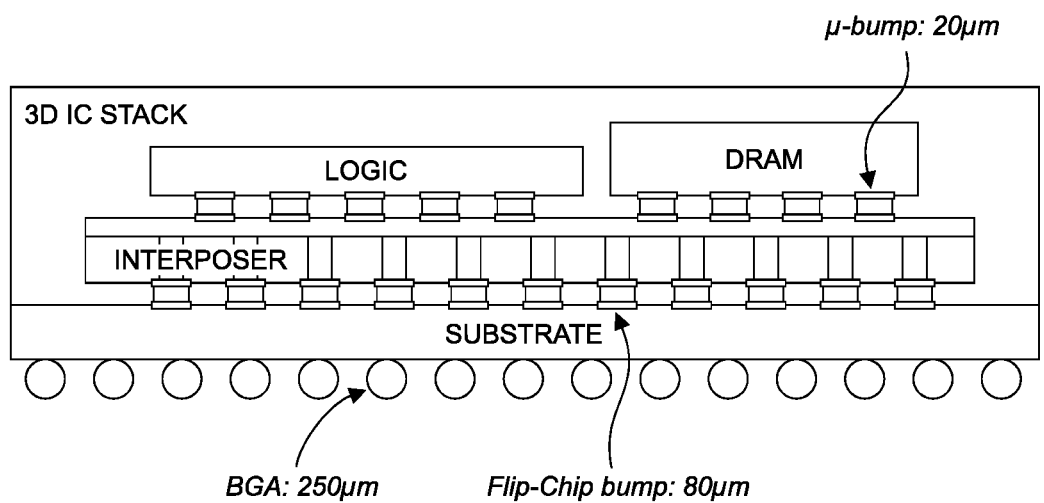
FIG. 2 shows schematically solder bumps of an Advanced Heterogeneous Packaging solution (2.5D IC package) example.

Reference is now made to FIG. 2, which shows solder bumps of an Advanced Heterogeneous Packaging solution example. Shown are some different levels of solder joints within an IC package, and between the IC package, the interposer and the circuit board. For example, the I/O buffer may drive a pad soldered to a micro-bump that connects the IC to an interposer die. Then, the interposer die is an example of a 2.5D/3D packaging technology.

For example, the I/O buffer may drive the I/O of a flip chip pad, such as a controlled collapse chip connection (C4) bump connected to the pad. The C4 bump is an example of a common packaging technology, and in the general case, the invention is applicable to any package technology, or any chip-to-chip packaging technologies. In this example (FIG. 2), the two dies are connected to each other via micro-bumps and the interposer chip. This is a two-way I/O link between transmitter (Tx) and receiver (Rx) at both ends. The flip-chip C4 bumps are used to connect the package to the interposer die. The BGA connects the package to the board. As mentioned above, the I/O buffer may drive a flip-chip bump, but this is not shown in the example of FIG. 2.

Optionally, electrically connection integrity is detected through one or more solder connections of an electronic package and/or circuit, such as micro-bumps, through-silicon via bumps, C4 bumps, package bumps (such as BGA balls), and/or the like.

Figure 3:
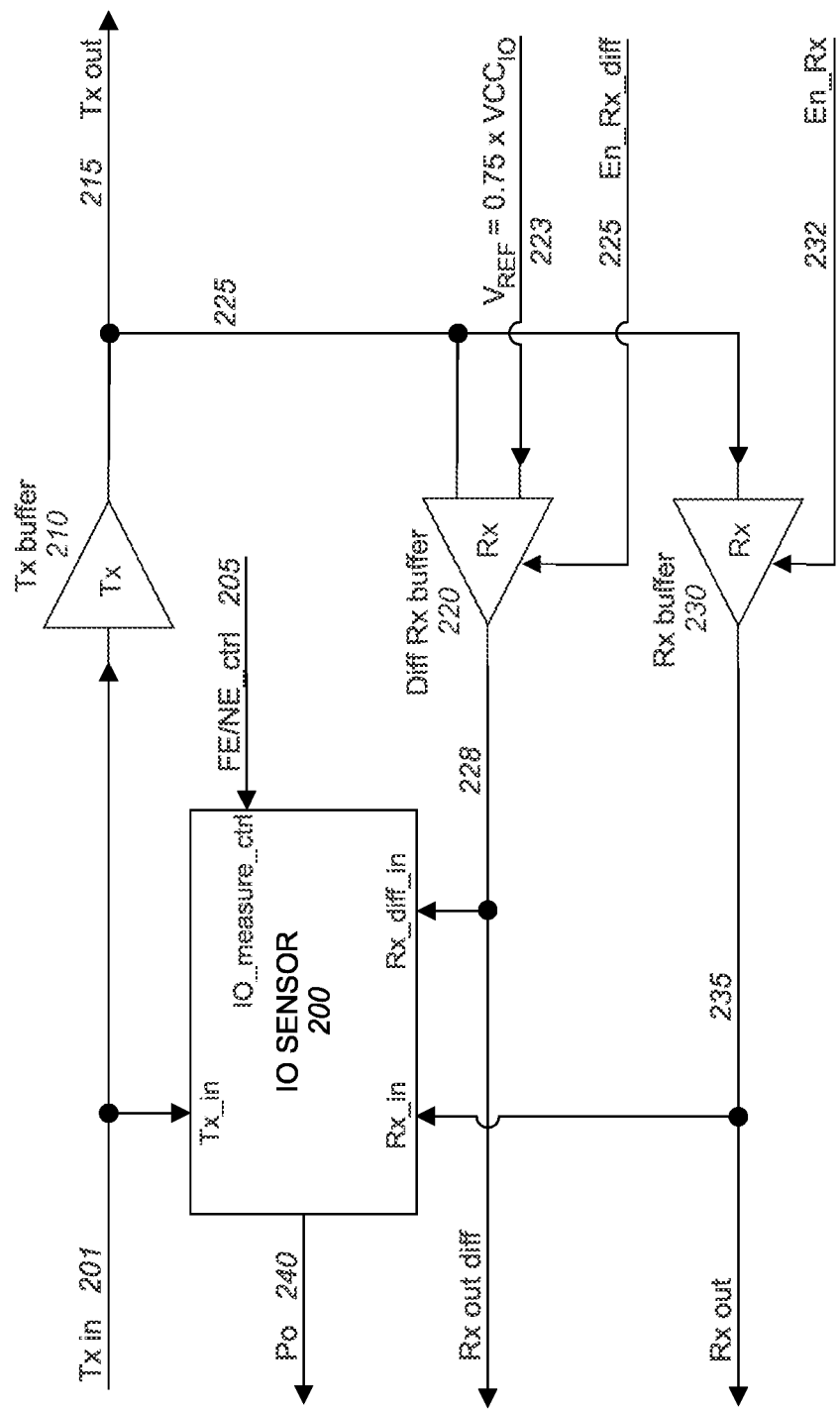
FIG. 3 shows a first embodiment of an Input/Output (I/O) block in accordance with the disclosure, comprising an I/O sensor.

Reference is now made to FIG. 3, which shows a first embodiment of an Input/Output (I/O) block in accordance with the disclosure, comprising an I/O sensor 200. The I/O sensor 200 is coupled within an I/O buffer arrangement, comprising: a transmission (Tx) buffer 210; a pseudo-differential receive (Rx) buffer 220; and a receive (Rx) buffer 230. The transmission input 201 is provided as an input to the Tx buffer 210 and also a first input (via a first port) to the I/O sensor 200. The Tx buffer 210 then provides an output 215 to a communication channel. The communication channel also provides an input 225 to the differential Rx buffer 220 and the Rx buffer 230. The Rx buffer 230 provides an output 235 as a second input to the I/O sensor 200 (via a second port). A second input to the differential Rx buffer 220 is a reference voltage 223. The reference voltage 223 is set at a proportion of the IC supply voltage (Vcc), the proportion being 75% in this case (although this value may be tunable). The differential Rx buffer 220 then provides an output 228 based on the difference between the input 225 and the reference voltage 223. The output 228 of the differential Rx buffer 220 is provided (via a third port) as a third input to the I/O sensor 200. A differential Rx buffer enable signal 225 is provided to the differential Rx buffer 220, to enable the differential Rx buffer 220 operation, and Rx buffer enable signal 232 is provided to the Rx buffer 230, to enable the Rx buffer operation.

An I/O sensor control signal 205 is also provided to the I/O sensor. Based on the I/O sensor control signal 205 (which can take one of two logical states), the output of the I/O sensor is based either on: the first input (the transmission input 201) and the third input (the output 228 of the differential Rx buffer 220); or the second input (output 235 of the Rx buffer 230) and the third input (the output 228 of the differential Rx buffer 220). In other words, the I/O sensor produces an output based on the third input and either the first input or the second input. The I/O sensor then generates an output Po 240, which depends on the timing difference between the signal edges (typically rising edges, but this can also operate on falling edges or on both falling and rising edges) of respective signals on each of the two inputs being used. The timing difference between the two signals advantageously corresponds with the I/O buffer load, as will be discussed further below. In the specific embodiment, the output Po 240 is generated as a pulse having a width indicative of the timing (e.g. slope) difference. The output Po 240 may be provided to a TDC (as discussed above), to provide a digital output indicative of the pulse width.

As will be discussed further below, this output may allow monitoring of bump degradation and more generally monitoring of one or more bump-arrays. The I/O sensor 200, particularly is embedding (or integration) within the I/O block, allows control of this measurement on-die. Moreover, the data may be collected during functional operation. This data may be uploaded to an analytics platform (for example, operative on computer 101A in FIG. 1). Using this monitoring data, analysis can be performed (either on-line or off-line). This may take place without interfering in the functional operation of the IC or system. There is also no need for a special test-mode or to stop the IC operation.

Figure 4:
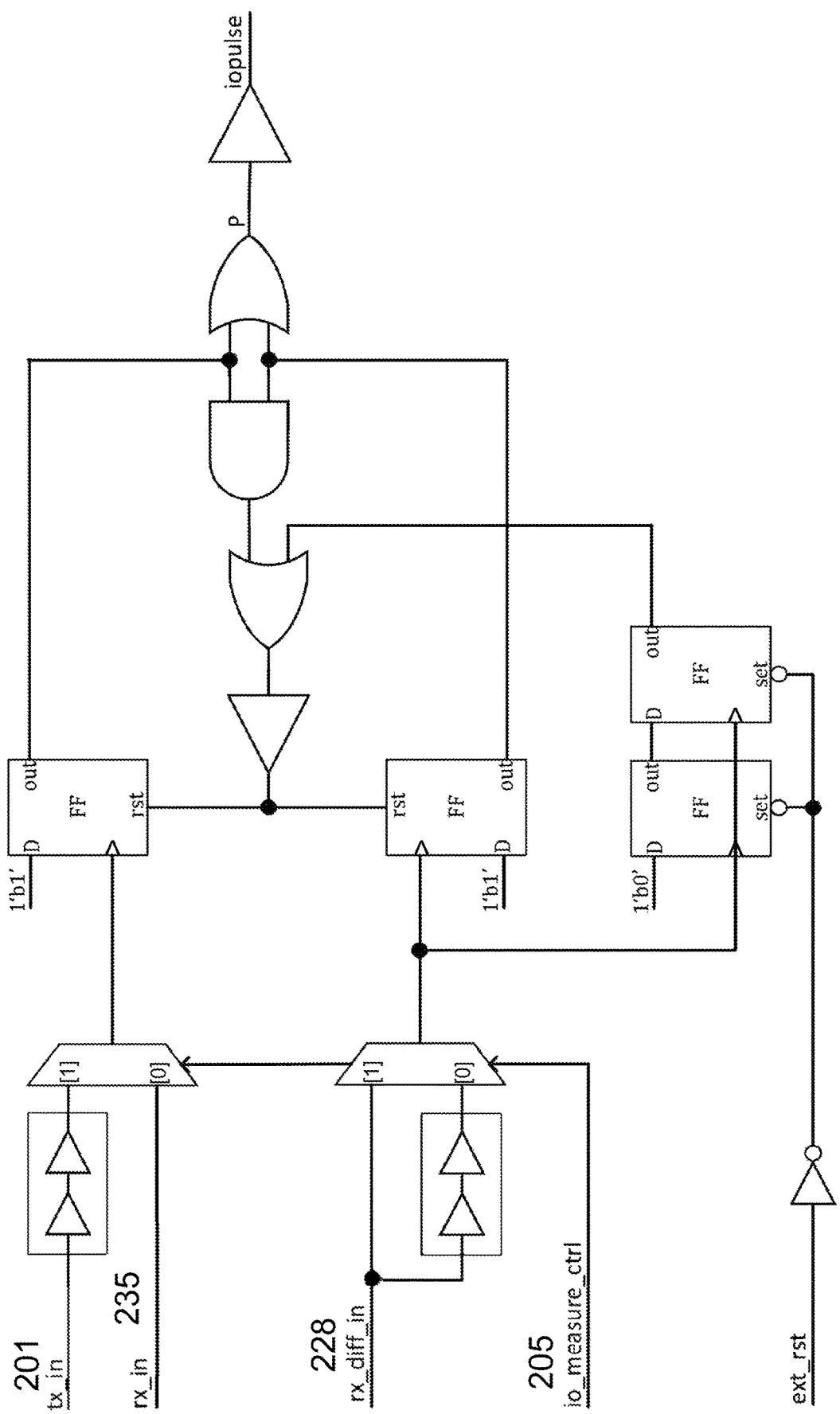
FIG. 4 shows an exemplary implementation of an I/O sensor in accordance with FIG. 3.

Reference is now made to FIG. 4, which shows an exemplary implementation of an I/O sensor in accordance with FIG. 3. Here, the effect of the I/O sensor control signal in selecting either the transmission input 201 or the output 235 of the Rx buffer 230 can be seen. An example digital circuit to produce a pulse having a width dependent on the timing difference between the rising edge of the signals compared is shown. The skilled person will appreciate that this can be implemented in other ways, however.

In general terms, there may be considered an input/output (I/O) block for a semiconductor integrated circuit (IC). The I/O block may comprise: at least one I/O buffer, configured to define at least one signal path, in particular first and second distinct signal paths, in respect of a connection to a remote I/O block via a communication channel, each signal path causing a respective signal edge slope; and an I/O sensor, coupled to the at least one signal path (particularly the first and second signal paths) and configured to generate an output signal indicative of a timing difference between the signal edge (slope) for the first signal path and the signal edge (slope) for the second signal path.

A semiconductor IC comprising the I/O block may also be considered. Then, the I/O sensor may be configured to communicate the output signal externally of the IC, for example using a communications interfacing or networking port. An I/O profiling part, configured to generate an I/O profile and/or classification, based on the output signal of the I/O sensor, may also be provided. Part or all of the post-processing may be performed on the IC, although in other embodiments, all of the post-processing may be performed on a separate platform. In embodiments, the at least one signal path (for example, the first signal path) is coupled to the remote I/O block via at least one connection bump and an I/O profile and/or classification may be based on a monitoring of the output signal of the I/O sensor over time. Preferably, a plurality of bumps (a bump array) may be monitored in this way. The I/O profile and/or classification may be one or more of: compared with family data for the semiconductor IC; used to detect a systematic shift based on the I/O profile and/or classification; and employed for detection of outliers based on tester data.

In embodiments, the I/O sensor comprises: a first input port coupled to the a first option for a first signal path; a second input port coupled to a second option for the first signal path; a third input port coupled to a second signal path; and a selector, configured to select the first or second input port in response to a received selection signal, such that the output signal of the I/O sensor is selectively indicative of a timing difference between the signal edge slope for the second signal path and the signal edge slope for the either the first option for the first signal path or the second option for the first signal path. For example, the I/O block may further comprise a differential buffer, configured to output a difference between a first signal (a differential buffer input signal), received on a signal path coupled to the communication channel, and a second, fixed level signal. Then, the third input port is preferably coupled to the output of the pseudo-differential buffer. The second, fixed level signal may be preset or dynamically adjustable and/or is advantageously a voltage fixed at a predetermined proportion of a DC power supply voltage for the IC. For example, the predetermined proportion may be higher than 50% and/or lower that 100%, more preferably higher than 60% and lower than 90% and most preferably at or around 75%. The at least one I/O buffer may comprise one or both of: a transmission buffer, the first input port being coupled to an output of the transmission buffer that is coupled to the communication channel; and a reception buffer having an input that is coupled to the communication channel, the second input port being coupled to an output of the reception buffer.

Figure 5:
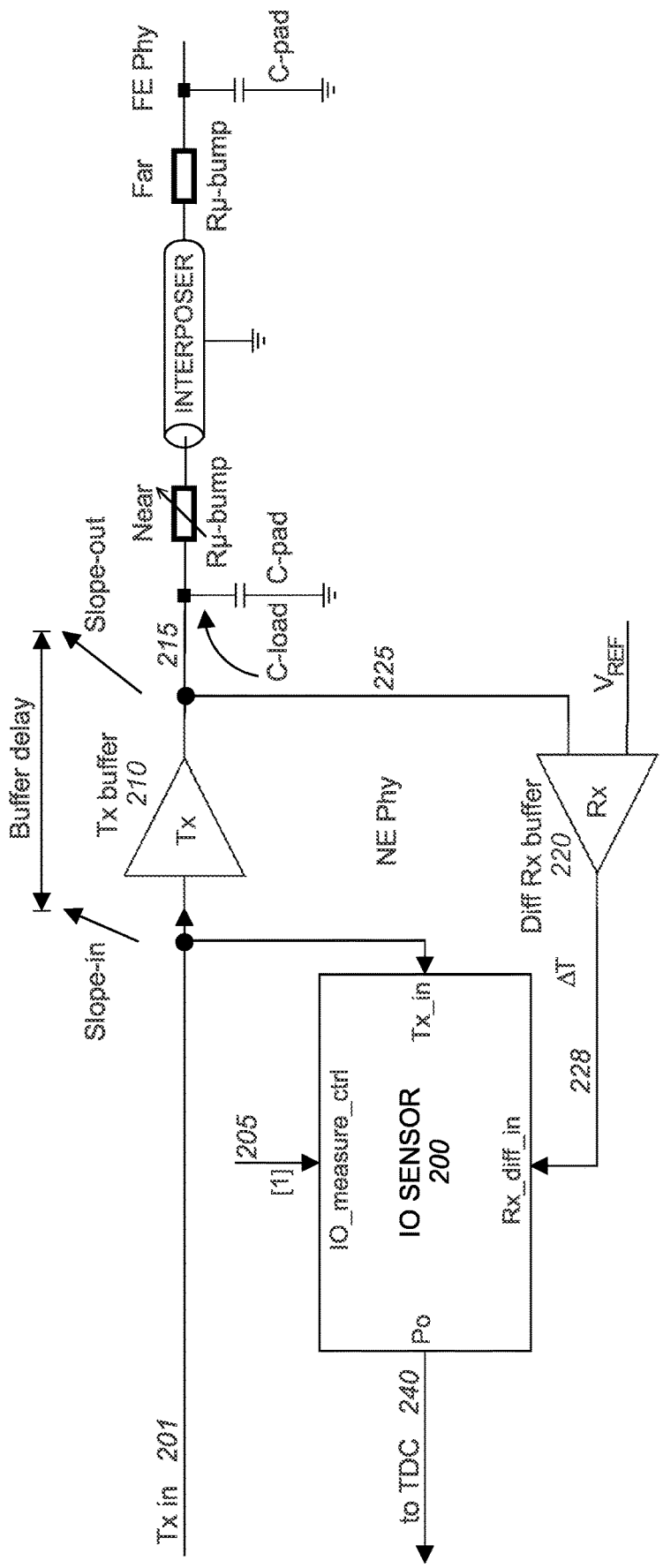
FIG. 5 shows an electrical schematic of a second embodiment of an I/O block in accordance with the disclosure, for measurement of near-end bump degradation on a bi-directional communication channel.

Reference is now made to FIG. 5, which shows an electrical schematic of a second embodiment of an I/O block in accordance with the disclosure, for measurement of Near-End (NE) bump degradation on a bi-directional communication channel. In other words, this is for sensing NE signal integrity. The communication channel is represented by: the pad capacitances (Cpad); the μ-bump resistances (Rμ-bump); and the interposer.

As can be seen, the I/O sensor control signal 205 is set to logic '1' (in accordance with the embodiment of FIG. 4, for instance). By so doing, the I/O-sensor 200 generates a pulse at output Po 240, having a width that is directly proportional to the delay difference between the transmission input 201 (Tx_in) and the output 228 of the pseudo-differential Rx buffer 220 (Rx-diff_in). The Tx_in to Rx-diff_in delay difference represents the delay between the signal edge of the transmission input 201 and that of the output 228 of the pseudo-differential Rx buffer 220 (the sum of the delay for the Tx-buffer 210 and delay for the pseudo-differential Rx-buffer 220). This delay is directly proportional to the effective buffer load. Any change in the effective buffer load will change the slope of the Tx-buffer output signal 215 and will affect the pulse-width at the output Po 240. For example, if the NE μ-bump resistance will increase, the effective buffer load will reduce, the slope of the Tx-buffer output signal 215 will be reduced and so the width of the pulse at the output Po 240 will also be reduced. The pulse-width of the signal at the output Po 240 is measured by a TDC. The TDC generates a digital readout that represents the pulse-width. Any change in the pulse width will change the TDC readout and will indicate a change in the measured NE μ-bump performance.

This approach may be useful for sensing receiving and/or transmission delay throughout the life-time of the IC. It may also thereby detect μ-bump resistance degradation over time and/or detect μ-bump intermittent disconnection.

Additionally or alternatively, this approach may be useful for scanning the reference-voltage (VREF) of the differential Rx buffer 220, for instance to characterize or measure the slew-rate at the pad (Tx-buffer output). It may be used to detect and limit EMI/RFI phenomenon caused by the buffer current-consumption-rate amplitude dI/dT. This will be discussed further below.

In embodiments, the second signal may be generated by a CMOS-based reception buffer having an input that is coupled to the communication channel. By so doing, the I/O-sensor 200 generates a pulse at the output Po 240, having a width that is directly proportional to the delay difference between the transmission input 201 (Tx_in) and the output of the CMOS-based Rx buffer. The Tx_in to Rx out delay difference in this case represents the loop delay between the signal edge of the transmission input 201 and that of the output of the CMOS-based Rx buffer (the sum of the delay for the Tx-buffer 210 and delay of the CMOS-based Rx-buffer). This delay is also direct proportional to the effective buffer load.

Figure 6:
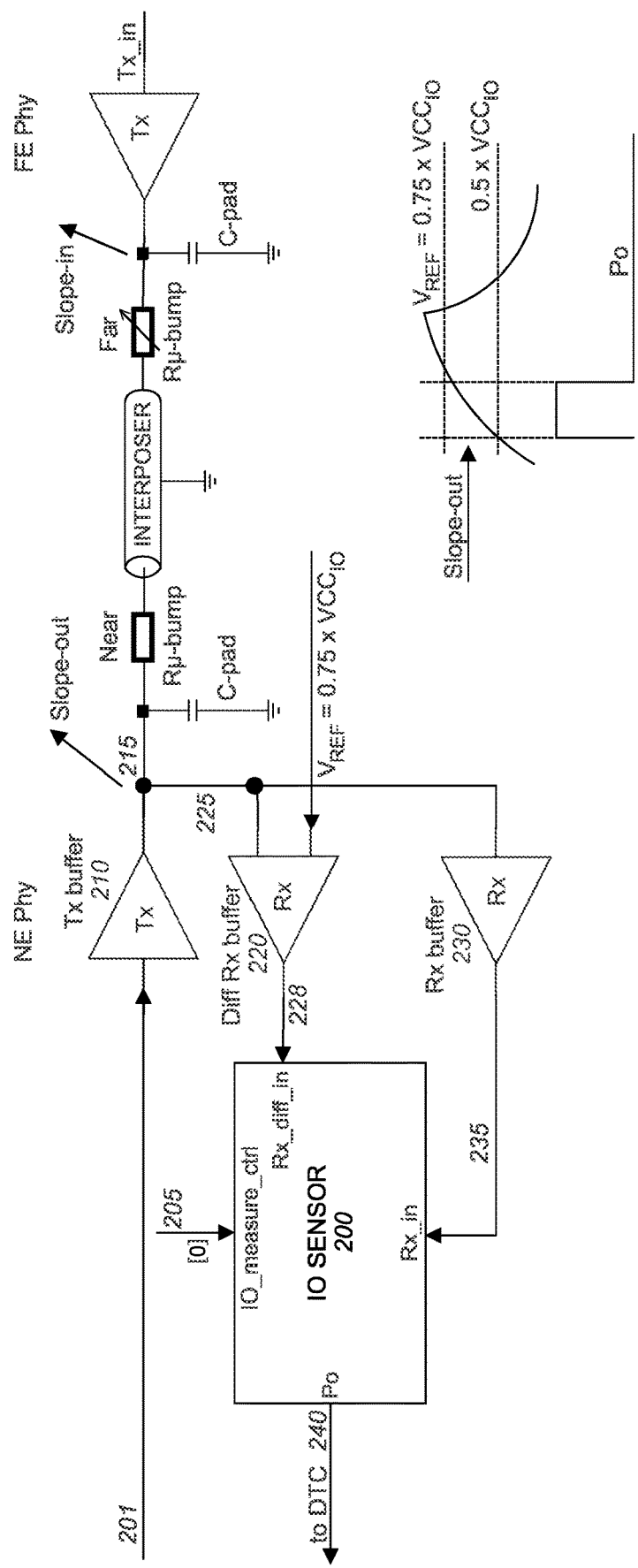
FIG. 6 shows an electrical schematic of third embodiment of an I/O block in accordance with the disclosure, for measurement of far-end bump degradation on a bi-directional communication channel.

Reference is now made to FIG. 6, which shows an electrical schematic of third embodiment of an I/O block in accordance with the disclosure, for measurement of Far-End (FE) bump degradation on a bi-directional communication channel. Here, the I/O sensor control signal 205 is set to logic '0' (in accordance with the embodiment of FIG. 4, for instance). In this way, The I/O-sensor 200 generates a pulse at output Po 240, having a width that is directly proportional to the delay difference between the output 235 of the Rx buffer 230 (Rx_in) and the output 228 of the pseudo-differential Rx buffer 220 (Rx-diff_in). The Rx_in to Rx-diff_in delay represents the timing difference (delay) between the signal edge of the output 235 of the Rx buffer 230 and the signal edge of the output 228 of the differential Rx buffer 220. This delay difference is directly-proportional to the Rx buffer 230 input slope (pad signal). Any change in the Rx buffer 230 input slope will affect the pulse-width at the output Po 240. For example, if the FE μ-bump resistance increases, the Rx_in slope increases and so will the width of the pulse at output Po 240. The pulse-width of the signal at the output Po 240 is measured by a TDC. The TDC generates a digital readout that represents the pulse-width. Any change in the pulse width will change the TDC readout and will indicate a change in the measured FE μ-bump performance.

The above discusses embodiments in which the I/O buffer is configured for bi-direction interfacing over the communication channel. However, measurement of uni-directional communication is also possible. Uni-directional signals are NE-only or FE-only signals. The same I/O-sensor 200 is used with a fixed configuration of the I/O sensor control signal 205. In accordance with the embodiment of FIG. 4, sensing only Near-End (NE) signal integrity is performed by setting the I/O sensor control signal 205 to logic '1'. Sensing only Far-End (FE) signal integrity is performed by setting the I/O sensor control signal 205 to logic '0'.

Returning the general terms discussed above, further optional features and/or generalized implementation details may be considered. For example, the at least one I/O buffer may comprise a transmission buffer. Then, the at least one signal path (for example, the first signal path) may be coupled to an output of the transmission buffer that is coupled to the communication channel. Optionally, the at least one signal path (for example, the first signal path) is further coupled to the remote I/O block via at least one connection bump. Then, the output signal of the I/O sensor may be further indicative of a quality of the at least one connection bump. In embodiments, the at least one signal path (for example, the second signal path) is coupled to an input of the transmission buffer. Then, the first signal path is coupled to the remote I/O block via an interconnect and a connection bump between the transmission buffer and the interconnect. In this case, the output signal of the I/O sensor may be further indicative of a quality of the connection bump.

Preferably, the I/O block further comprises: a pseudo-differential buffer, configured to output a difference between a differential buffer input signal, received on a signal path coupled to the communication channel, and a fixed level signal, the at least one signal path (for example, the second signal path) being coupled to the output of the differential buffer. The pseudo-differential buffer may be as discussed above. In this way, the I/O sensor output may then represent the time difference between the first signal path and the output of the differential buffer.

In such embodiments (where the at least one signal path, such as the second signal path, is coupled to the output of the differential buffer), two options can be considered. In a first option (as discussed above), another signal path of the at least one signal path (such as the first signal path) is coupled to the input of the transmission buffer, coupled to the communication channel (and thus typically coupled to the remote I/O block via at least one connection bump). In a second option, the least one I/O buffer comprises a reception buffer having an input that is coupled to the communication channel. Then, another signal path of the at least one signal path (such as the first signal path) is coupled to an output of the reception buffer. The input to the reception buffer is optionally coupled to the remote I/O block via an interconnect and a connection bump between the interconnect and remote I/O block. Then, the output signal of the I/O sensor may be further indicative of a quality of the connection bump.

Figure 7:
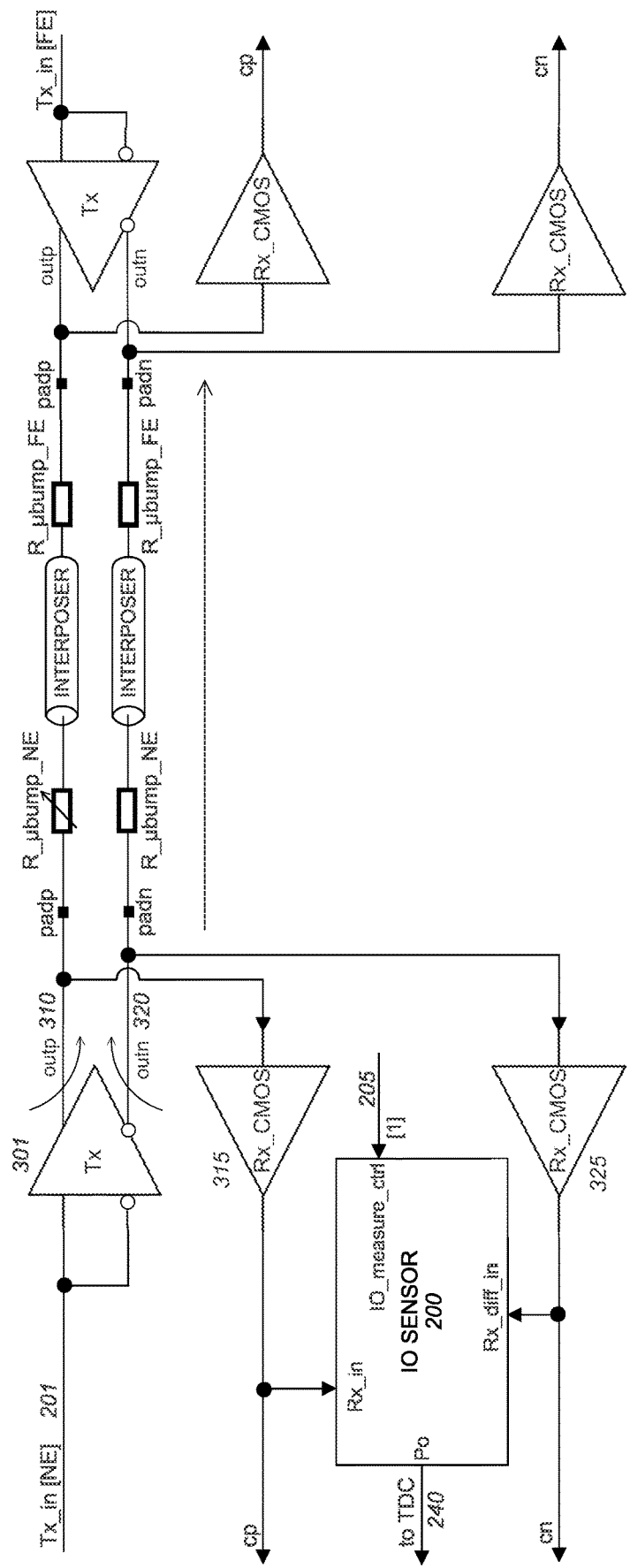
FIG. 7 shows an electrical schematic of fourth embodiment of an I/O block in accordance with the disclosure, for measurement of near-end bump degradation on a differential communication channel.

In embodiments, the I/O buffer may use differential signaling across the communication channel. Reference is now made to FIG. 7, which shows an electrical schematic of fourth embodiment of an I/O block in accordance with the disclosure, for measurement of near-end bump degradation on a differential communication channel. The transmission buffer 301 produces two differential outputs: a first output 310 (outp); and a second output 320 (outn). In this case, Near-End (NE) differential signal integrity sensing is performed by setting the I/O sensor control signal 205 to logic '1'. The I/O-sensor 200 generates a pulse at the output Po 240, having a width that is directly proportional to the delay difference between the first output 310 via a first receive buffer (Rx_CMOS) 315 (provided on the Tx_in or cp port of the I/O sensor 200) to the second output 320 via a second receive buffer (Rx_CMOS) 325 (provided on the Rx-diff_in or cn port of the I/O sensor 200). The Tx_in to Rx-diff_in delay difference is directly-proportional to the mismatch between the effective load of the first differential buffer output 310 (outp) and the second differential buffer output 320 (outn). Any change in the mismatch between these two effective loads will affect the pulse-width at the output Po 240. For example, if the resistance of the NE μ-bump connected to the first output 310 (outp) increases, the effective load of first output 310 (outp) reduces relative to the effective load of the second output 320 (outn) and it will change the width of the pulse at the output Po 240. The pulse-width of the signal at Po is measured by a TDC. The TDC generates a digital readout that represents the pulse-width. Any change in the pulse width will change the TDC readout and will indicate a change in the measured NE Differential μ-bump performance.

Figure 8:
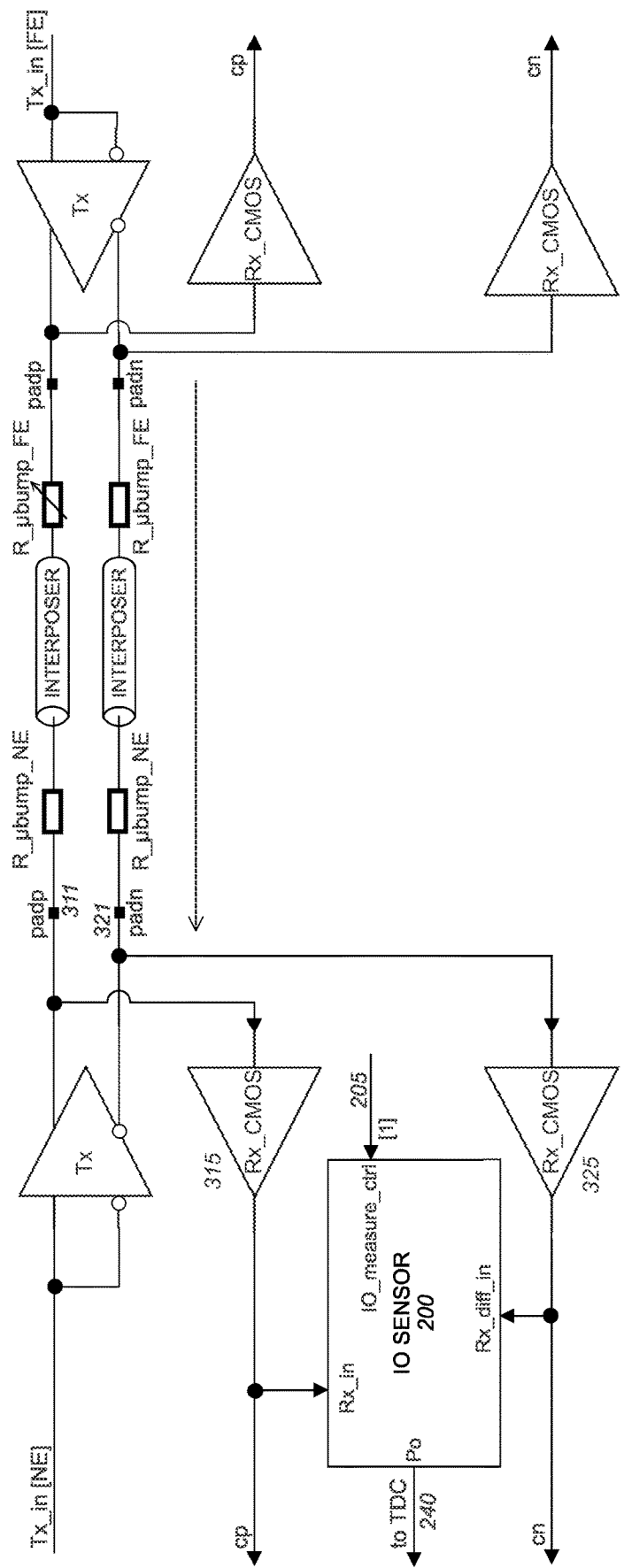
FIG. 8 shows an electrical schematic of fifth embodiment of an I/O block in accordance with the disclosure, for measurement of far-end bump degradation on a differential communication channel.

Reference is now made to FIG. 8, which shows an electrical schematic of fifth embodiment of an I/O block in accordance with the disclosure, for measurement of far-end bump degradation on a differential communication channel. Far-End (FE) Differential signal integrity sensing is performed by setting the I/O sensor control signal 205 to logic '1'. Two differential inputs are provided from the remote end via the communication channel: a first input 311 (padp); and a second input 321 (padn). The I/O-sensor 200 will generate a pulse at the output Po 240, having a width that is directly proportional to the delay difference between the first input 311 (Tx_in or cp) and the second input 321 (Rx-diff_in or cn). The Tx_in to Rx-diff_in delay difference is directly-proportional to the mismatch between the signal slopes of the first differential buffer input 311 (padp) and the second differential buffer input 321 (padn). Any change in the mismatch between the signals slopes at the first differential buffer input 311 and the second differential buffer input 321 will affect the pulse-width at the output Po 240. For example, if the resistance of the FE μ-bump connected to the first differential buffer input 311 (padp) increases, the signal slope at the first differential buffer input 311 (padp) increases relative to the signal slope at the second differential buffer input 321 (padn). This changes the width of the pulse at the output Po 240. The pulse-width of the signal at the output Po 240 is measured by a TDC. The TDC generates a digital readout that represents the pulse-width. Any change in the pulse width will change the TDC readout and will indicate a change in the measured FE differential μ-bump performance.

Reference is again made to the generalized terms discussed above. In embodiments, the communication channel is configured to carry a differential signal via two signal lines. Then, the first signal path may be coupled to a first signal line and the second signal path may be coupled to a second signal line. In such cases, the at least one I/O buffer may comprise a transmission buffer configured to provide a differential output via the two signal lines. Then, the first signal path may be coupled to a first output of the transmission buffer coupled to the first signal line and the second signal path may be coupled to a second output of the transmission buffer coupled to the second signal line. In embodiments, the first signal line comprises a first interconnect coupled to the transmission buffer via a first near-side connection bump and the second signal line comprises a second interconnect coupled to the transmission buffer via a second near-side connection bump. Then, the output signal of the I/O sensor may be further indicative of a quality of the first and second near-side connection bumps. In embodiments, the first signal line comprises a first interconnect coupled to the remote I/O block via a first far-side connection bump and the second signal line comprises a second interconnect coupled to the remote I/O block via a second far-side connection bump. Then, the output signal of the I/O sensor may be further indicative of a quality of the first and second far-side connection bumps.

Characterization and/or validation can be based on a number of features. For NE performance, power/performance optimization (for example, by its characterization against NE driver strength) and/or detection of marginal pins for lane repair can be used. For FE performance, eye pattern parameters may be considered, for example one or more of: eye-width opening per pin; eye-height opening per pin; and eye-width jitter (min-max) per pin. FE marginal pin detection can also be performed, including considering one or more of: detection of weak pins for lane repair; systematic issues caused by design or manufacturing; and outlier detection based on large sampled data.

The implementations described above are well-suited to measurement and/or analysis for memory ICs without termination, for example HBM2. However, newer memory designs such as HBM3 include termination, for instance with a pseudo open drain driver. As a result, the low logical level may be higher than 0V. No CMOS-based Rx buffer is therefore used in designs for such ICs. The I/O sensor within the I/O block can take advantage of this design for alternative FE measurement and/or analysis.

Figure 9:
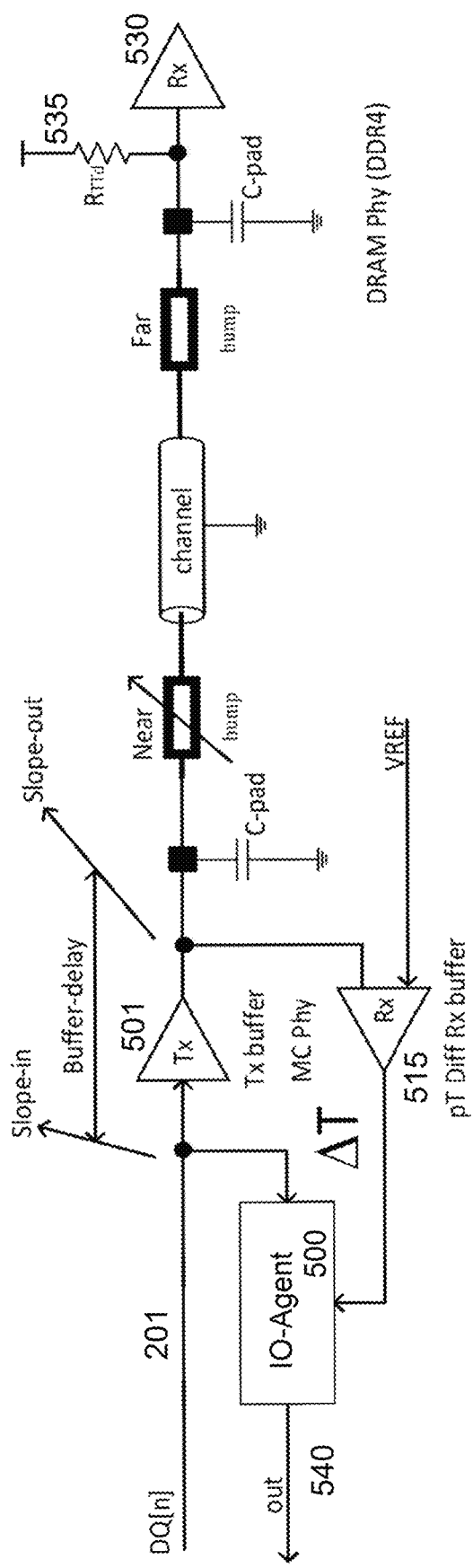
FIG. 9 shows an electrical schematic of a sixth embodiment of an I/O block in accordance with the disclosure, for measurement of near-end bump degradation on a bi-directional communication channel, implementing a termination resistor.

Reference is now made to FIG. 9, which shows an electrical schematic of a sixth embodiment of an I/O block in accordance with the disclosure, for measurement of near-end bump degradation on a bi-directional communication channel, implementing a termination resistor. The embodiment comprises: transmission input 201; NE Tx buffer 501; NE differential Rx buffer 515; and FE Rx buffer 530. An additional terminating resistor 535 is shown at the FE Rx buffer 530. The I/O Agent (sensor) 500 operates similarly to the I/O Agent 200 described above with reference to FIG. 5. The I/O sensor 500 generates an output Po 540, which depends on the timing difference between the signal edges of respective signals on each of the two inputs being used (from the input to the NE Tx buffer 501 and the output of the NE differential Rx buffer 515). This output is provided to a TDC (not shown).

Figure 10:
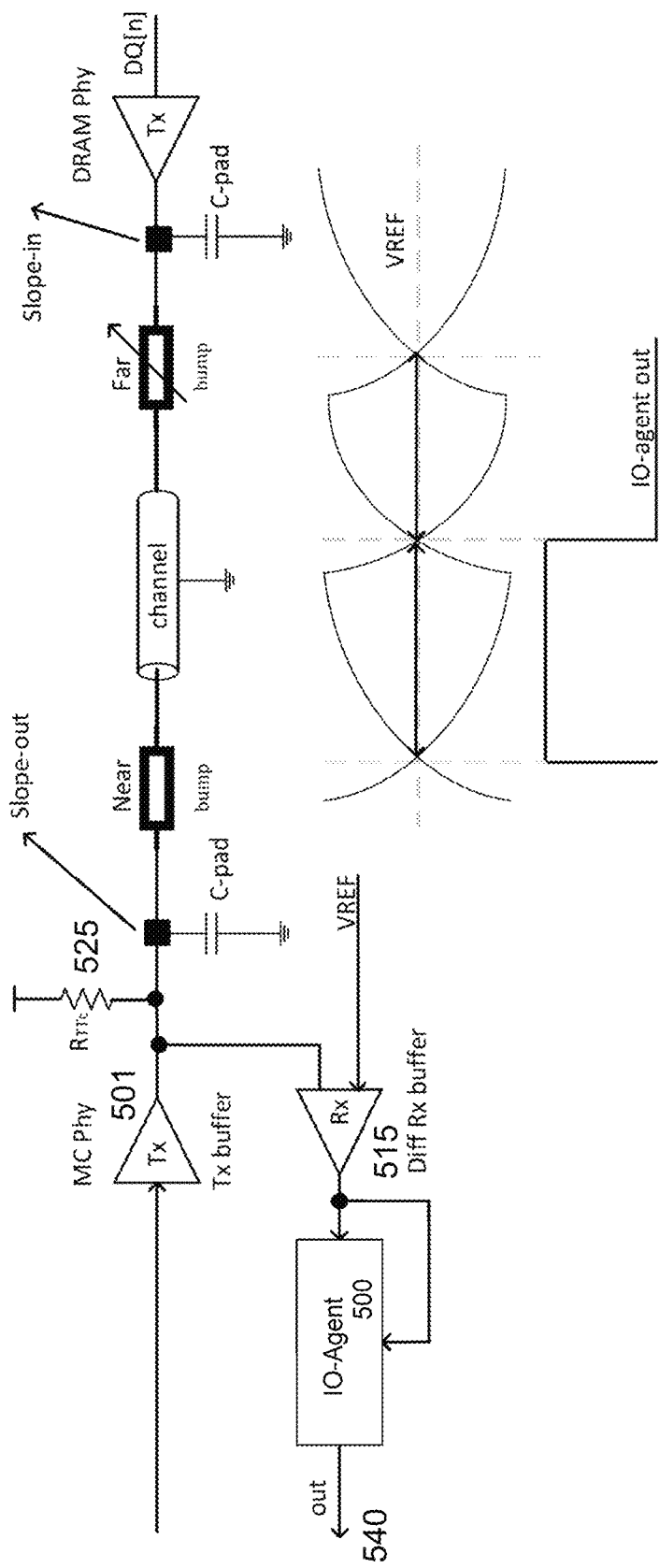
FIG. 10 shows an electrical schematic of a seventh embodiment of an I/O block in accordance with the disclosure, for measurement of far-end bump degradation on a bi-directional communication channel, implementing a termination resistor.

Reference is now made to FIG. 10, which shows an electrical schematic of a seventh embodiment of an I/O block in accordance with the disclosure, for measurement of far-end bump degradation on a bi-directional communication channel, implementing a termination resistor. In this case, the near-end for the I/O sensor 500 acts as the receiver. The additional terminating resistor 525 is shown at the NE Tx buffer 501 and NE differential Rx buffer 515. The I/O sensor 500 measures the eye pattern at VREF, in particular two eyes: rise-to-fall; and fall-to-rise. In particular, the eye width and/or eye height of each eye pattern can be directly measured. The I/O sensor 500 generates the output Po 540, which indicates the measured eye pattern parameter (for example, by pulse width). Again, the output 540 is provided to a TDC (not shown).

Figure 11:
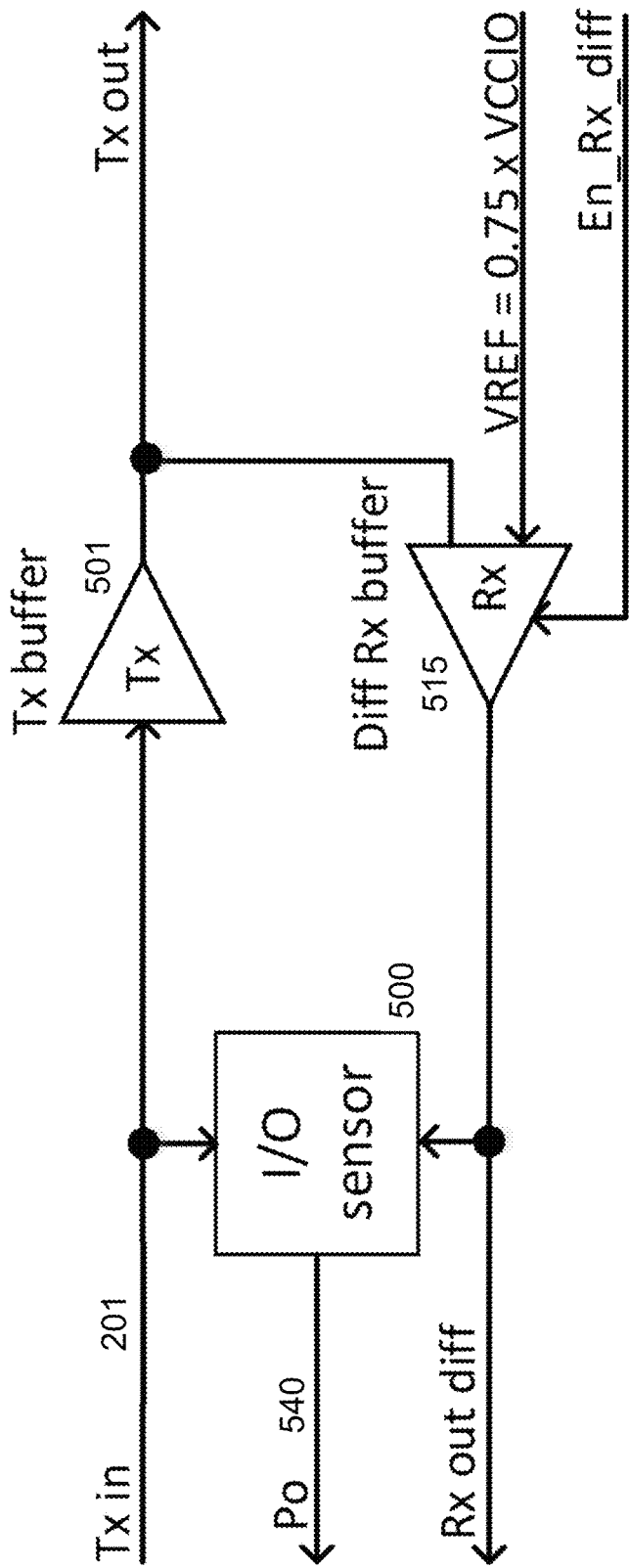
FIG. 11 shows a further exemplary implementation of an I/O sensor in accordance with a variant of the embodiment shown in FIG. 3.

Reference is made to FIG. 11, which shows a further exemplary implementation of an I/O sensor 500, such as shown in FIG. 9 and FIG. 10. The I/O sensor 500 is therefore provided with two inputs: an input to the Tx buffer 501; and an output from the differential Rx buffer 515. The differential Rx buffer 515 also has an enable signal (En_Rx_Diff). The I/O sensor 500 can measure: the timing difference between the signals on the two input paths (for NE performance); and/or an eye pattern parameter of the input provided by the output of the differential Rx buffer (for FE performance). The eye pattern parameter may be one or more of: eye width; eye-width jitter; and eye height. The output signal 540 is indicative of the measured parameter. The performance may be characterized against driver strength and/or VREF (in particular for FE performance).

In a generalized sense, there may be considered an input/output (I/O) block for a semiconductor integrated circuit (IC), the I/O block comprising: at least one I/O buffer, configured to define at least one signal path in respect of a connection to a remote I/O block via a communication channel (each signal path causing a respective signal edge slope); and an I/O sensor coupled to the at least one signal path (for example, first and/or second signal paths) and configured to generate an output signal indicative of an eye pattern parameter for the at least one signal path. The eye pattern parameter may comprise one or more of: eye width; eye height; eye width jitter; and eye height fluctuation. This may be combined with any other aspect, embodiment or feature disclosed herein and also extended to any other embodiment (for example, those using a differential communication channel).

Figure 12:
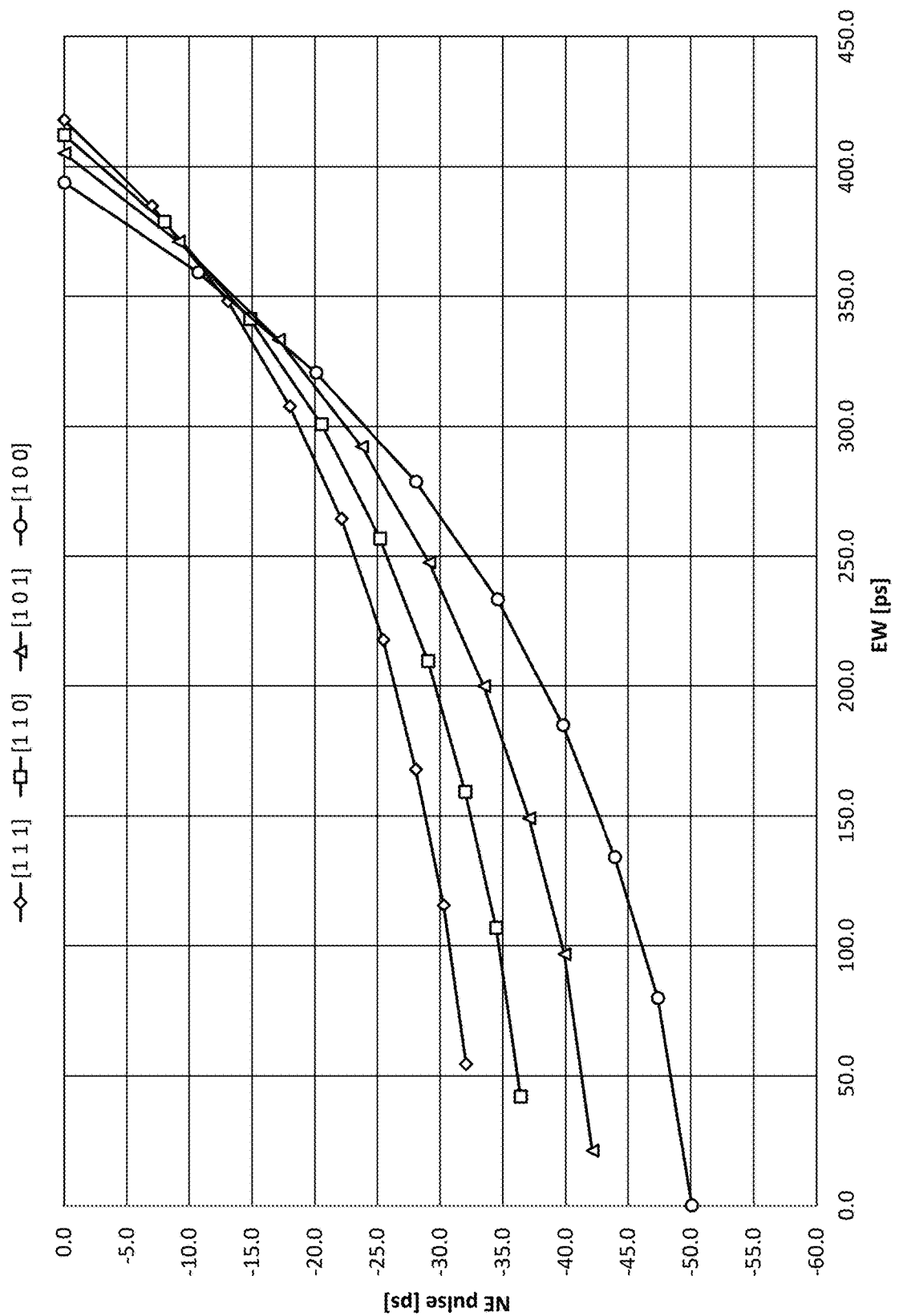
FIG. 12 shows a graph of measured near-end pulse duration.
Figure 13:
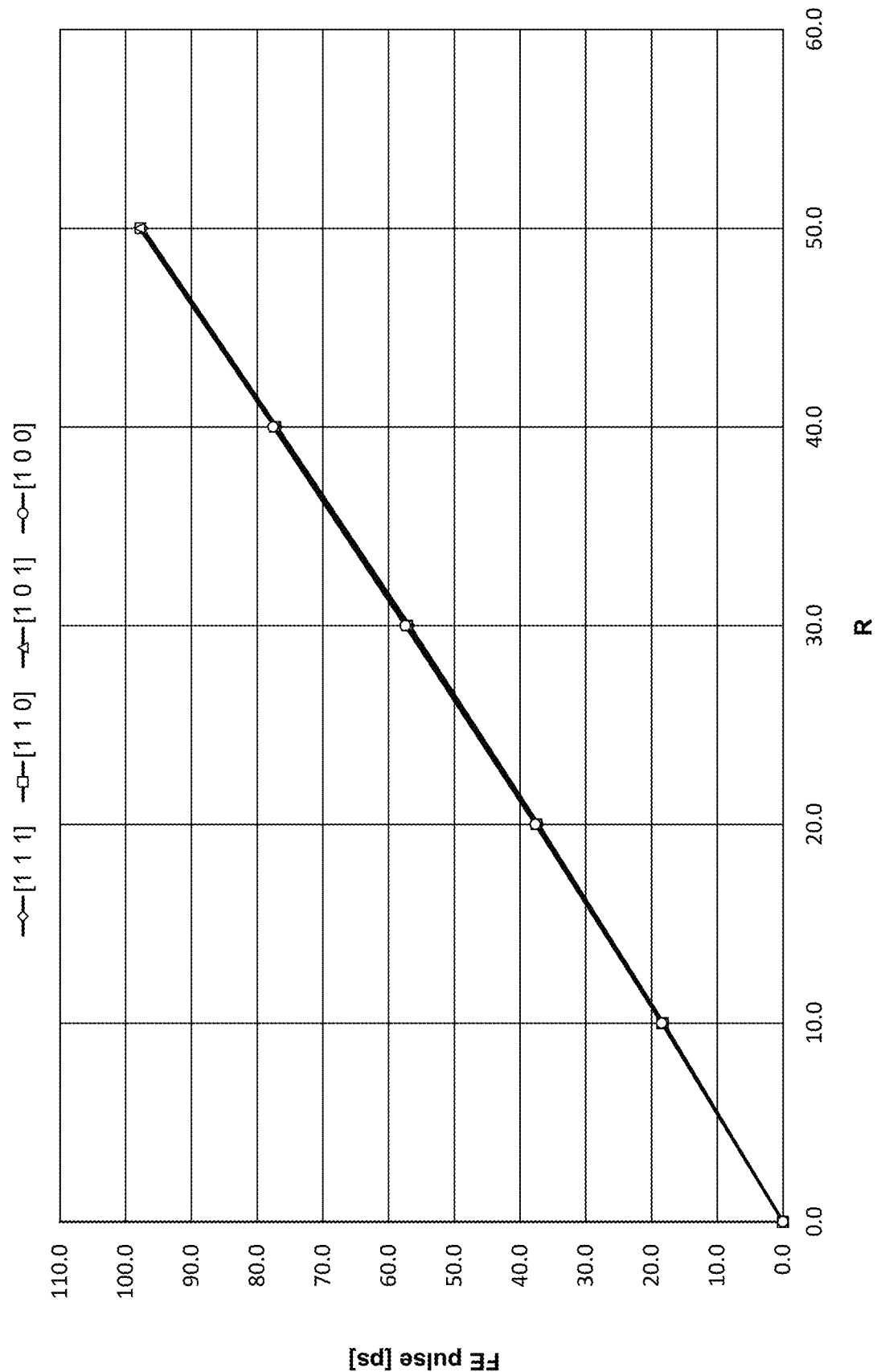
FIG. 13 shows a graph of measured far-end pulse duration.

Reference is now made to FIG. 12, which shows a graph of measured near-end pulse duration against NE µ-bump resistance and FE Eye-Width (EW). In this case, the x-axis represents far-end EW, the y-axis represents pulse-width change, and the dots are on the graph represents the 0-100 ohms near-end µ-bump resistance. The different curves show results at different strength of Tx-buffer 210. Reference is then made to FIG. 13, which shows a graph of measured far-end pulse duration. Here, the x-axis represents the FE µ-bump resistance and the y-axis represents the pulse-width. As can be seen from FIG. 12 and FIG. 13, the approach of the present disclosure allows monitoring of functional bumps coupling the I/O of the IC, which allows degradation over-time to be detected, analyzed and, in embodiments, mitigated.

The output of the I/O sensor can be used for a variety of purposes, such as: NE pin monitoring, in which the measured NE-pulse width per pin is analyzed over-time; FE pin monitoring, comprising analyzing time the measured FE-pulse width per pin over time; monitoring and/or data processing; changing the buffer drive-strength; disabling part or all of the IC; and activating the lane-repair function for marginal pins. Some of these may be considered I/O repair functions and may be performed as part of an initial on-test and/or in-field.

For example, a software based "lane-repair" or "lane re-map" mechanism may replace a lane with a failure (such a data path) with a spare lane. The lane remapping may be by writing a register (soft) or by cutting an eFuse (hard). Lane repair and power optimization may work together. For example, when all redundant pins have been used (due to lane repair and/or remapping), the Tx buffer strength may be increased to permit continued operation and thereby increase the time available until offline repair is possible.

In particular, the output of the I/O sensor may be used for bump-array monitoring and/or measuring (and monitoring) the degradation of multiple pins during functional operation. This is beneficially effected without interfering with the functional operation of the system. The measurement may be advantageously controlled on die. The data is collected during functional operation and may then be uploaded to the analytic platform (as discussed above). This may permit on-line and/or off-line analysis of the measured data, for instance by machine-learning algorithms (or other data analytical techniques) at the analytic platform. The analytic platform may use other data, such as instantaneous temperature and/or voltage for the analysis. In particular, there is no need for a special test-mode or for stopping the IC operation.

In embodiments, the I/O block comprises a time-to-digital converter, configured to receive a timing signal derived from the output signal of the I/O sensor (this may optionally include the output signal of the I/O sensor itself) and to provide a digital time signal based on the timing signal.

In another embodiment, the output of the I/O sensor may be used to determine and/or characterize a signal amplitude and/or signal slew-rate at the pin. This capability may enable an Embedded Virtual Scope (EVS) part, which may be applied per pin of the IC. EVS capabilities are described with reference to FIGS. 19 to 21, discussed below.

Figure 14:
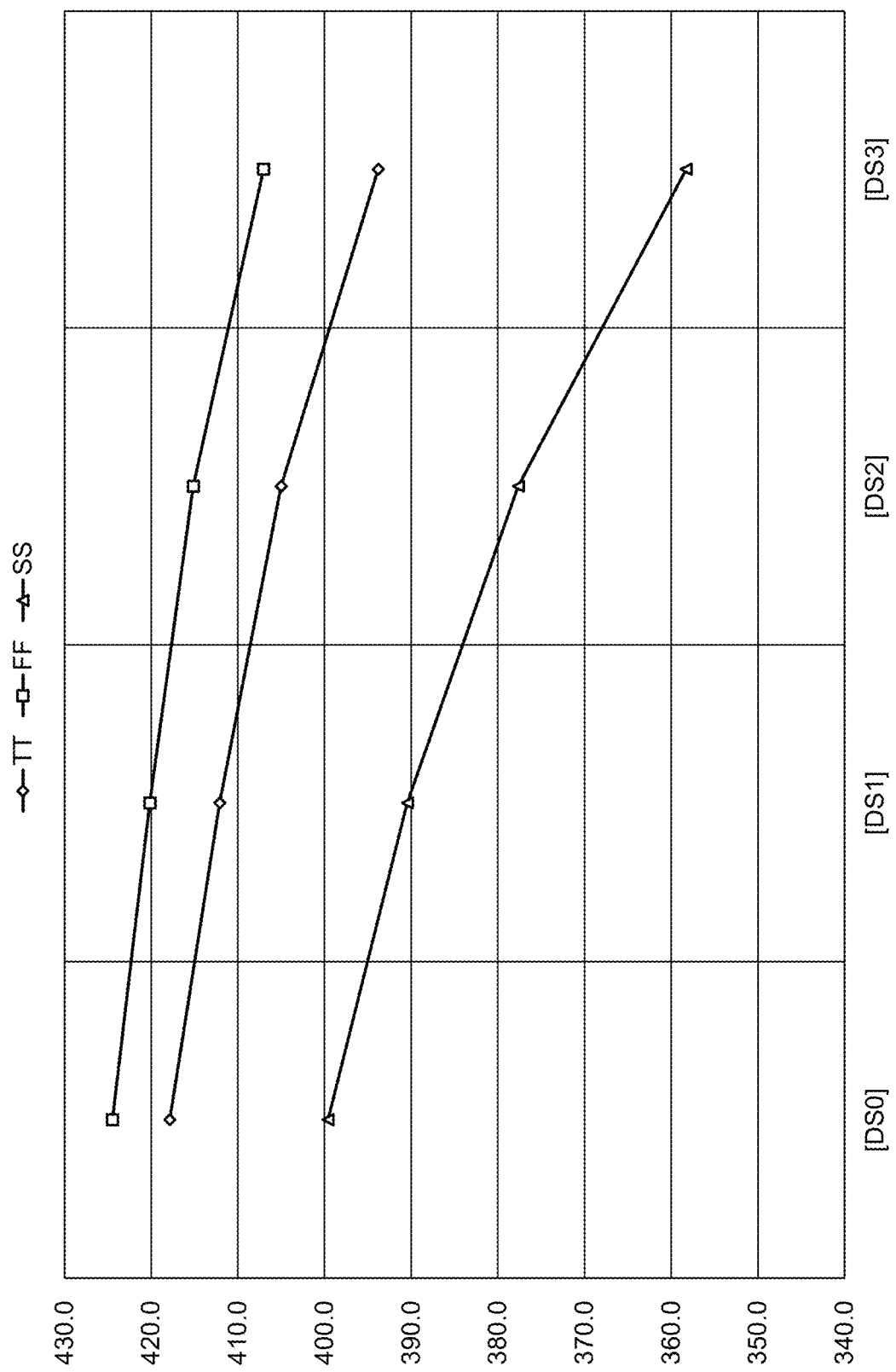
FIG. 14 shows a graph of eye-width against buffer strength.
Figure 15:
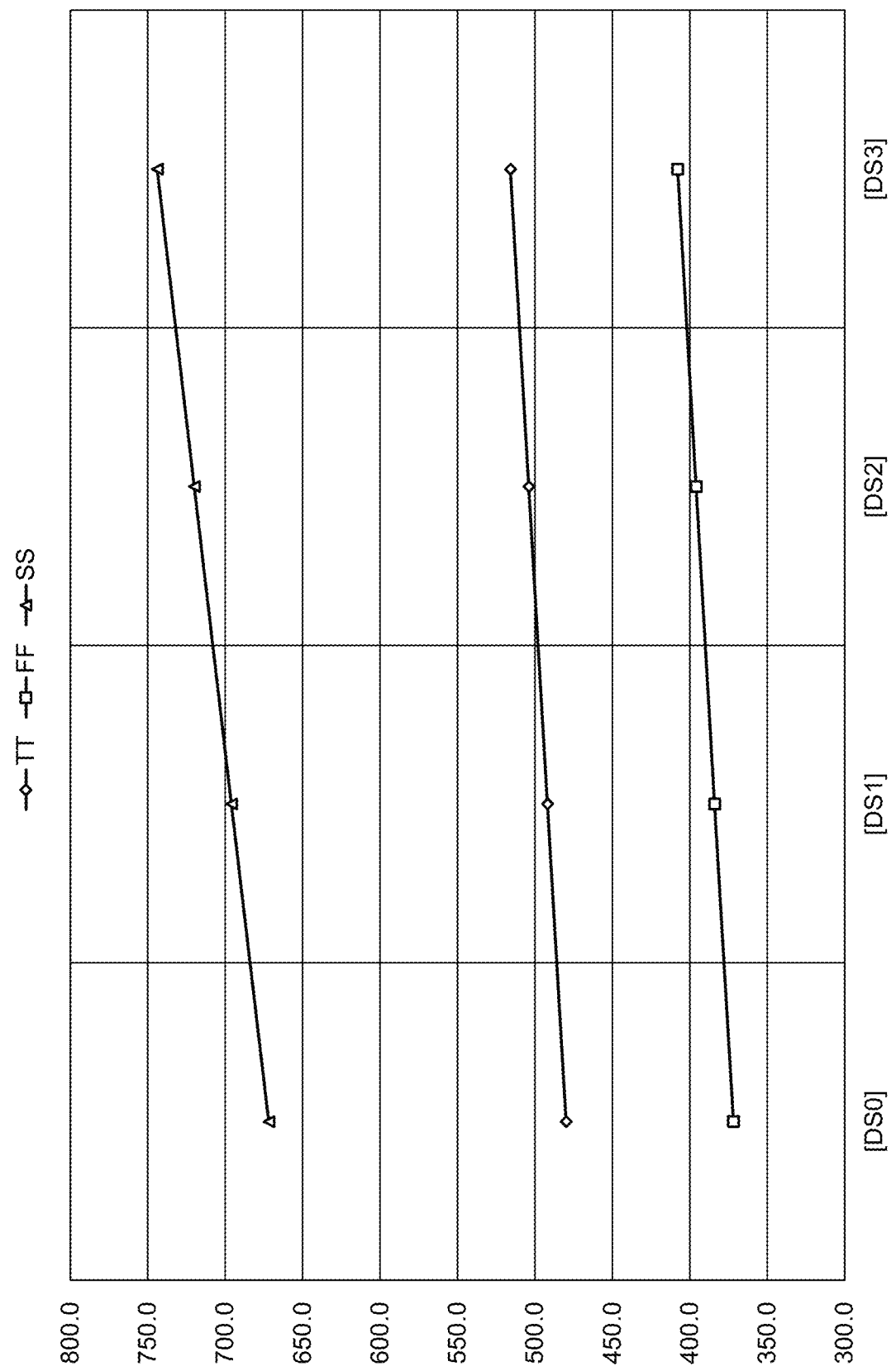
FIG. 15 shows a graph of simulated near-end pulse width against buffer strength.

Reference is now made to FIG. 14, which shows a graph of eye-width against buffer strength and FIG. 15, which shows a graph of simulated near-end pulse width against buffer strength. Existing I/O buffer designs may use excess drive strength. The techniques disclosed may allow optimization of the drive strength. For example, it may be understood that eye width is proportional to signal quality and pulse width correlates to eye width. Therefore, it may be possible to measure pulse width at different buffer strengths and if available, correlate this to the pin-measured bit error rate (BER). The data may be further correlated to process corner, based on family information and/or to history. Then, channel characteristics may be extracted and using these, a distinction may be made between good performance and bad performance (needing repair). An optimal buffer strength can then be set, which can be monitored (and if needed alerts provided) throughout the lifetime of the IC.

Reference is now made to FIGS. 16 to 21, which show an analysis of examples reflecting real-Si data. The term "integrity insight" that will be used in the explanation of these figures means an offline-analysis of the measured pulse duration, whether at the near-end or far-end respectively. The analysis in the example presented was performed by an IC analyzer (equivalent to IC analyzer 102B of FIG. 1), which provides platform-based analysis and alerts, for example based on machine learning and/or data analytics.

Figure 16:
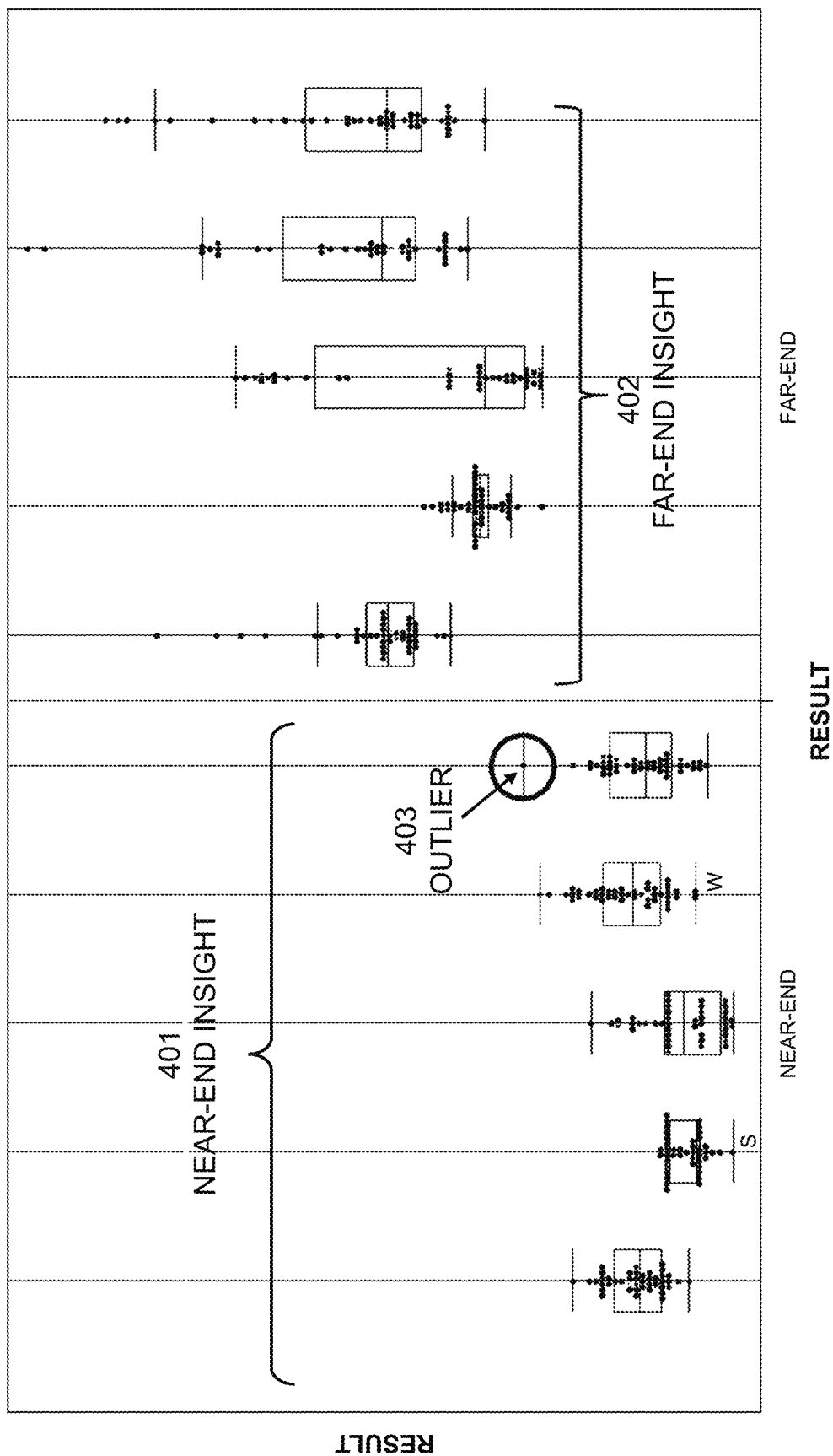
FIG. 16 shows an example reflecting real-Si data of the near-end and far-end integrity offline analysis.

Reference is made to FIG. 16, which shows the near-end integrity insight 401 and the far-end integrity insight 402 of four I/O blocks. Each block is composed of 46 active pins. The plot shows the distribution of the near-end and far-end integrity insights. Referring to the near-end integrity insight 401, the plot shows the near-end transmit (Tx) driving map per group and per pin within a group. A weak group (W) and a strong group (S) can be observed. By equalizing the driving map (per group or per pin), the total I/O power can be optimized. In this example, by equalizing the driver strength of the strong group (S) to be equal with the weak group (W), power can be saved. The plot also shows an observation of an outlier pin 403, that is a pin with near-end insight value located on the edge of the distribution. Referring to the far-end integrity insight 402, the plot shows the received performance (Rx-performance) map. Greater variation of the far-end insight can be observed in certain blocks; this is a result of data-dependent Inter-Symbol Interference (ISI).

Figure 17:
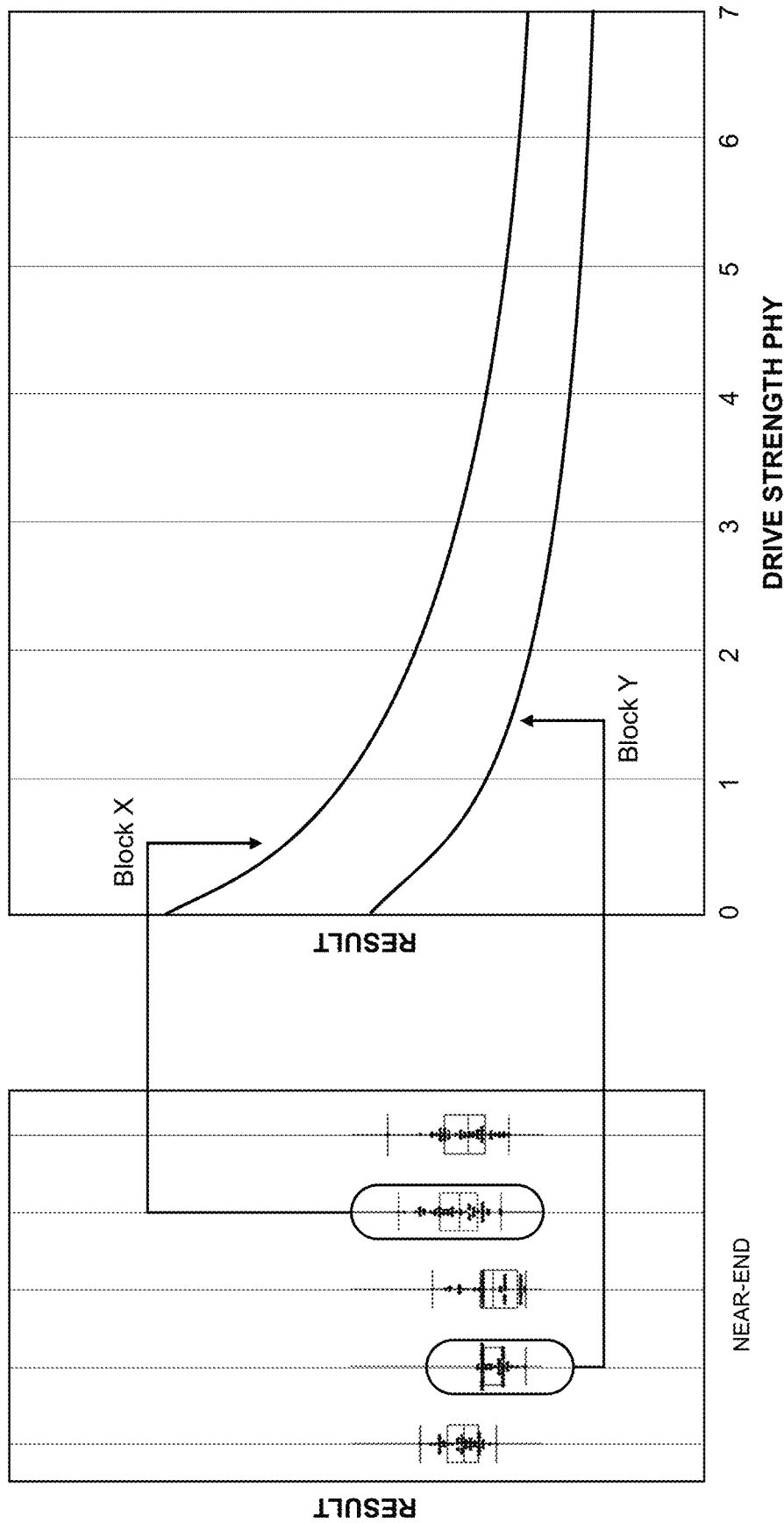
FIG. 17 shows an example reflecting real-Si data of the sensitivity of near-end integrity offline analysis to transmitter driver strength.

Referring now to FIG. 17, there is shown the average sensitivity of the near-end integrity insight to driver strength of Block X and Block Y. The sensitivity of the near-end insight is around 0.5 LSB. The absolute value is also observed.

Figure 18:
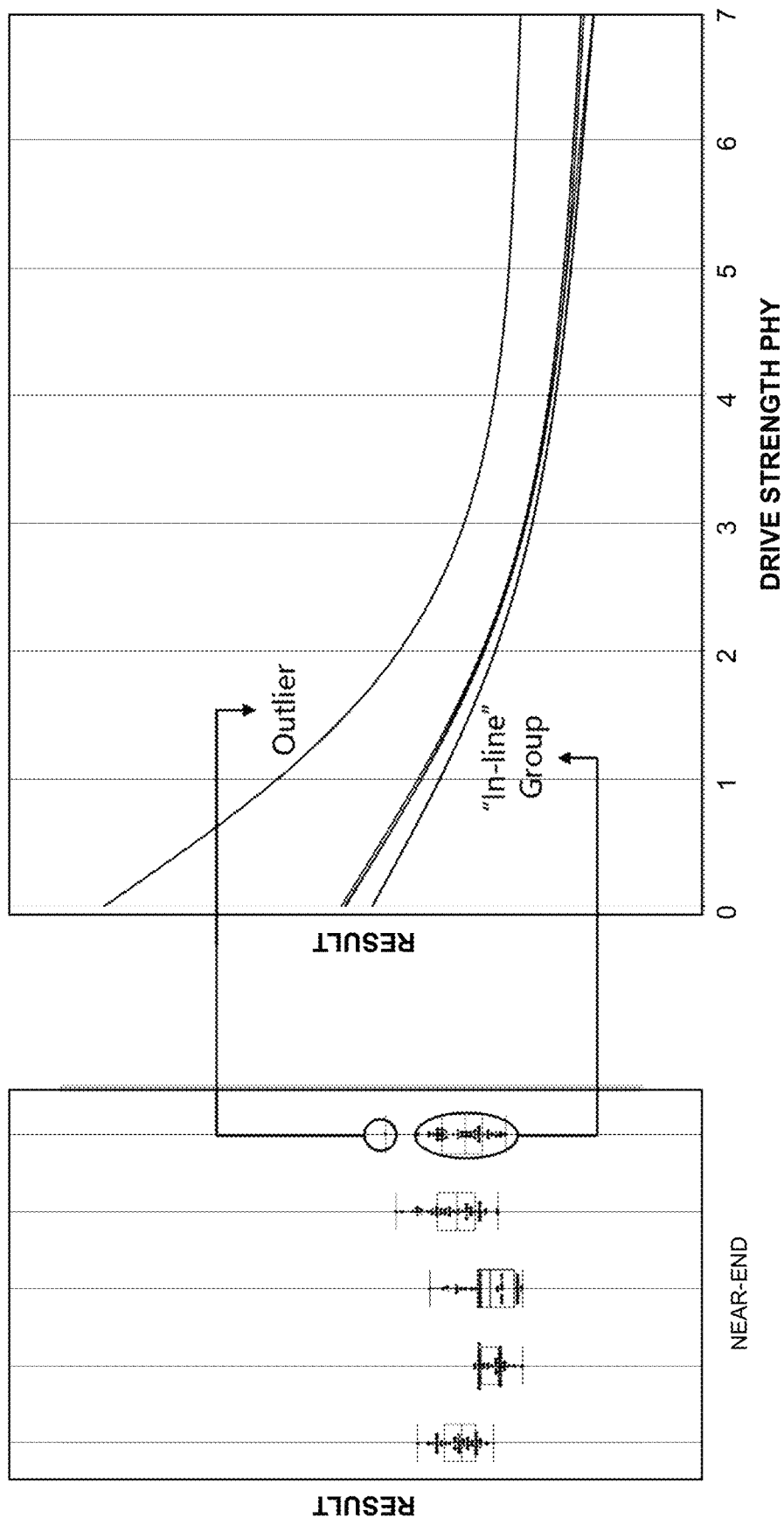
FIG. 18 shows an example reflecting real-Si data of a weak pin (outlier) analysis.

Reference is now made to FIG. 18, which shows a weak pin (outlier) analysis of a real chip. The behavior of the weak pin is compared to the behavior of a normal pin both statistically and electrically, with both identifying an outlier.

Figure 19B:
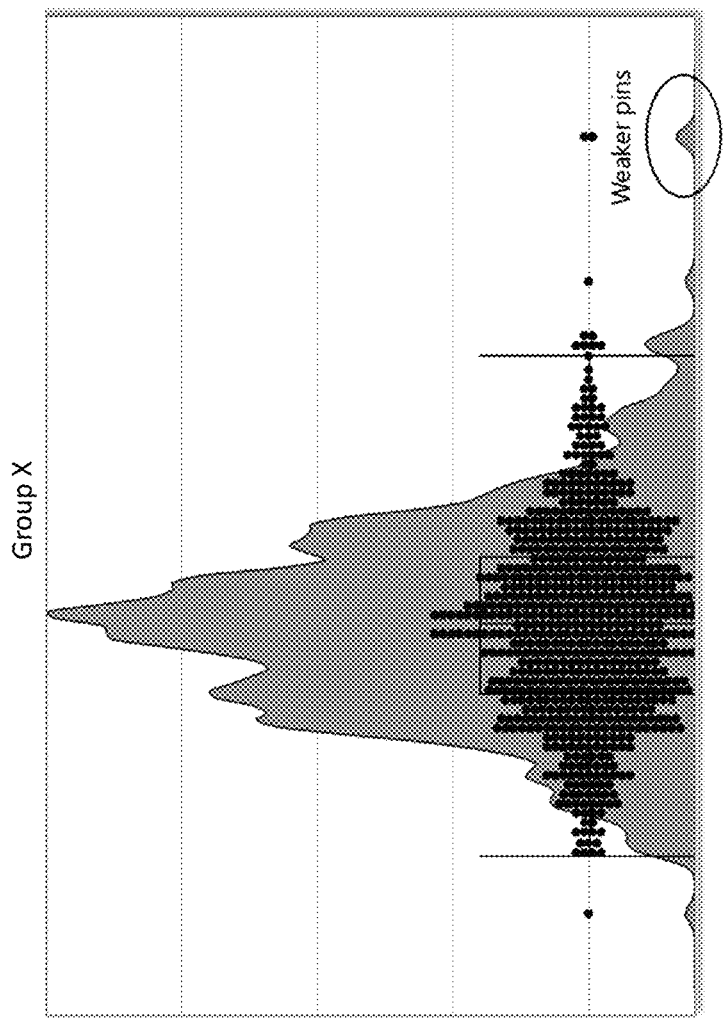
FIGS. 19A and 19B show an example reflecting real-Si data of receiver performance distribution.
Figure 19A:
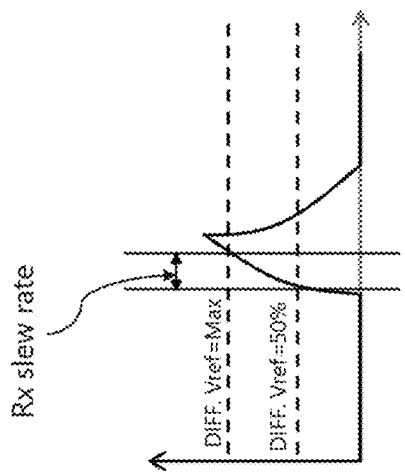

Referring now to FIGS. 19A-19B, there is shown the distribution of the Rx-performance insight data from a real chip. The Rx-performance insight is a measure of the slew-rate (in ps/V) of the received-signal at the pin. The sensitivity of the measurement equal to 1-LSB/50 mV, gives 1-LSB as 10 ps.

Figure 20:
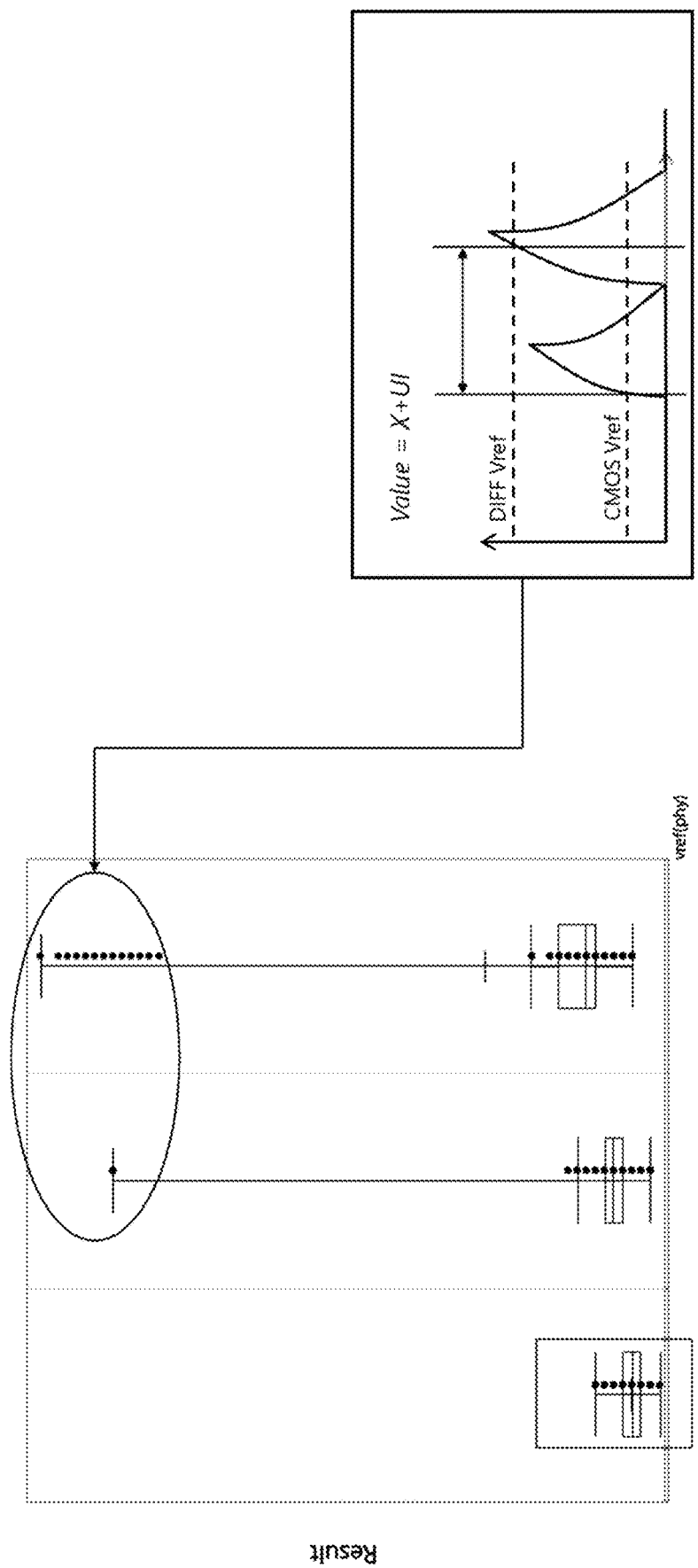
FIG. 20 shows an example reflecting real-Si data of far-end signal analysis using Embedded Virtual Scope (EVS) capabilities.

Reference is now made to FIG. 20, which shows far-end signal analysis using Embedded Virtual Scope (EVS) capabilities. The plot shows the far-end integrity insight of a real chip. Deviant values, which are caused by low amplitude received signal at the pin can be observed. The received signal amplitude can be measured by lowering the VREF to the point which the deviant values are cleaned. At this point, the received signal amplitude is equal to the VREF value. The VREF resolution is determined by the design. Such deviant or exceptional values may therefore have an impact on analysis and the setting of VREF. This effect may be corrected, as will be discussed below.

Figure 21B:
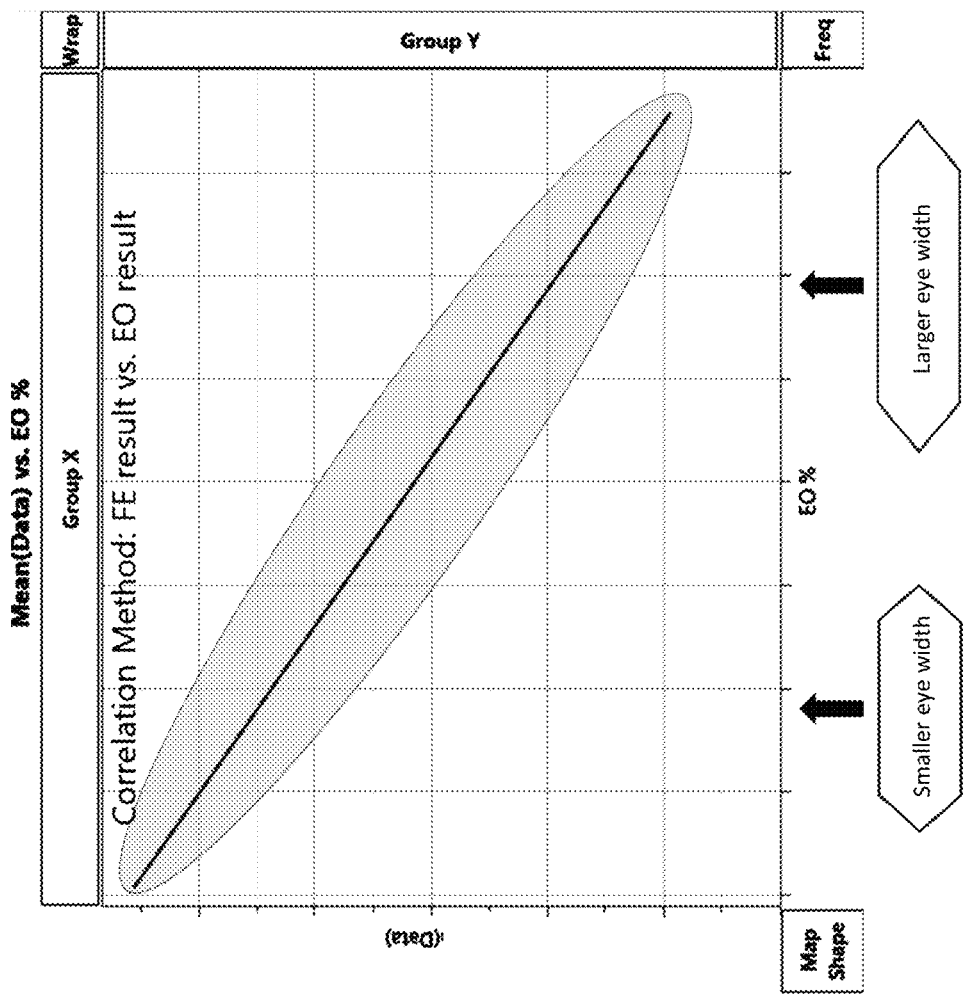
FIGS. 21A and 21B show an example reflecting real-Si data of the far-end correlation of offline analysis to eye opening.
Figure 21A:
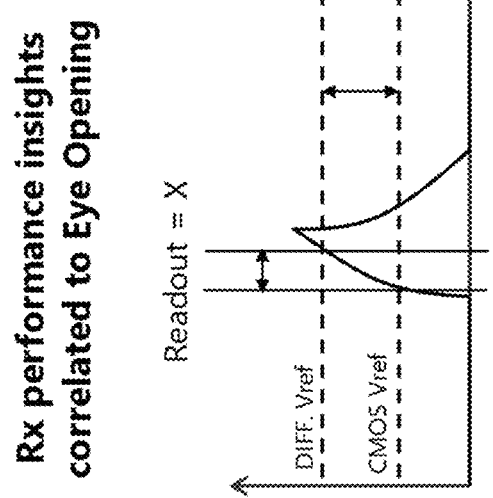

Referring now to FIGS. 21A-21B, there is shown the correlation of far-end insight to eye opening. A linear correlation can be seen.

As noted above, deviant or exceptional values may have an impact on analysis. For example, the FE sensitivity may be limited by the lone-bit detectability. This effect can be especially pronounced when looking at eye pattern measurements, such as eye width and/or eye height. Removing the exceptional readouts that are caused by the lone-bits may allow an increase in VREF and improvement in FE sensitivity. Many exceptional readouts in a certain data pattern can affect average performance values and shift any calculated statistics, such as averages. This may affect the ability to detect degradation over time. This effect may be seen at high transfer rates, such as at 3.2 GT/s. Advantageously, such exceptional readouts may be filtered from the results, in particular at a post-TDC summation. This may mitigate the effect of average shifting and/or improve the detection of the average change at life-time operation.

Figure 22:
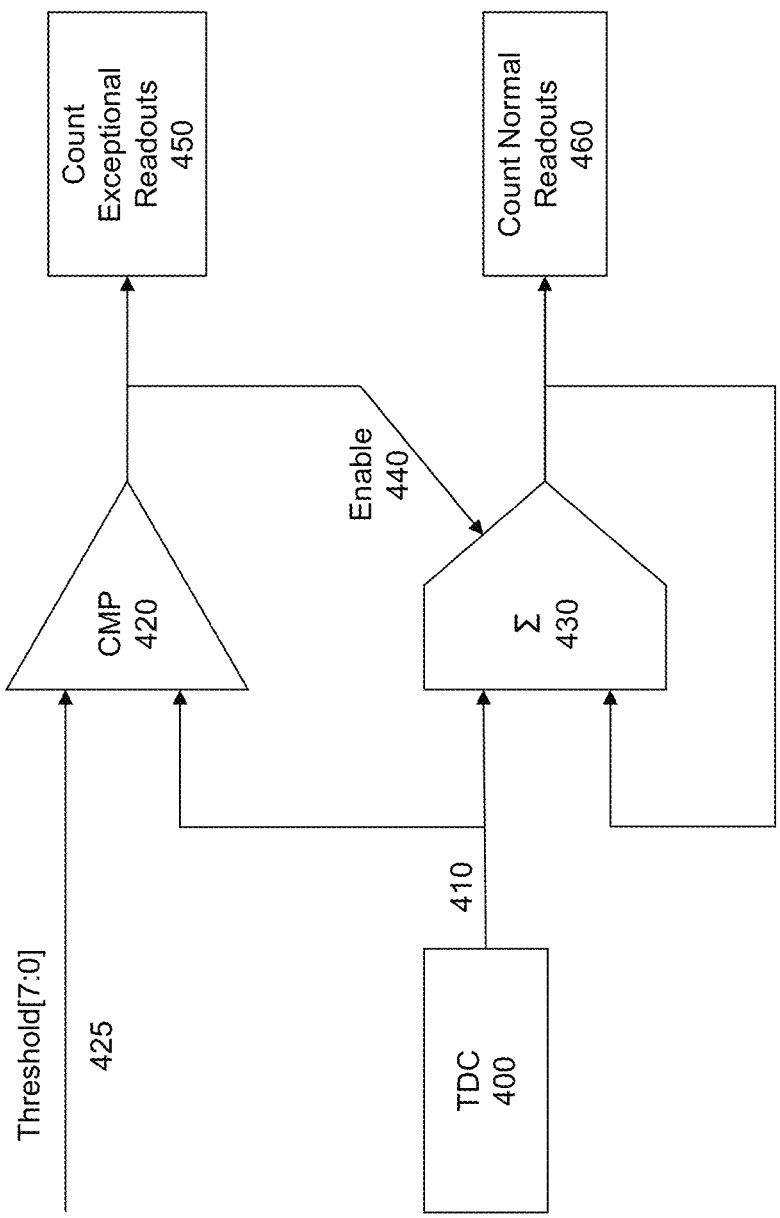
FIG. 22 shows a schematic block diagram of a firmware-based filter.

Referring now to FIG. 22, there is shown a schematic block diagram of a firmware-based filter. Such a filter may be used as part of readout summation, in particular, post-TDC summation, as discussed above. The input to the filter is provided by TDC 400, which provides a digital output 410. The filter comprises: a comparator (CMP) 420; a summation block 430; an exceptional readout counter 450; and a normal readout counter 460.

The comparator 420 has a first input comprising a threshold level 425. The digital output 410 of the TDC 400 is provided as a second input to the comparator 420. Where the TDC output exceeds the threshold level 425, a high logical level output is provided to the exceptional readout counter 450. This high logical level is also provided as an enable signal 440 to the summation block 430. The summation block 430 also receives the digital output 410 of the TDC 400 as an input and with feedback, provides its output to the normal readout counter 460. In this way, a count of both normal readouts and exceptional (outlier) readouts may be obtained.

As part of the testing stage, the system may be operated at a low frequency to measure the average PW. No exceptional readouts would be expected at low frequency operation. As part of the data analysis, a threshold may be determined (calculated) at the platform and subsequently downloaded to the IC. The threshold can be fused to the IC or downloaded on each system activation. In a less preferred approach, the threshold can be determined based on simulations and hard coded into the IC.

More than one type of outlier may be possible. For example, there may be separate outliers in respect of a CMOS VREF and in respect of a differential comparator VREF. These can be accounted for by the use of multiple thresholds.

In a generalized sense, there may be considered a filtered counter block (for example in firmware on the IC), configured to receive a time signal based on the output signal of the I/O sensor (for example via a TDC), to compare the received time signal against a threshold and based on the comparison, to identify exceptional or outlier readouts from the I/O sensor. The filtered counter block may be further configured to count the number of normal readouts from the I/O sensor and/or the number of exceptional or outlier readouts from the I/O sensor. The threshold may be received from a platform external the IC and/or may be updated dynamically, for example at IC initialization. A method of monitoring the I/O block on an IC may comprise: comparing a time signal that is based on the output signal of the I/O sensor, against a threshold; and identifying exceptional or outlier readouts from the I/O sensor, based on the comparison. Advantageously, the method may also comprise: counting the number of normal readouts from the I/O sensor and/or the number of exceptional or outlier readouts from the I/O sensor.

Further benefits may be available by: detecting logic-path & Through-Silicon Via (TSV) delay degradation at the Phy input; detecting thermal-stress; measuring I/O-missioning per pin to correlate to the pin performance degradation; generating I/O families; outlier detection; identifying systematic shifts; and detecting or distinguishing between different degradation mechanisms. Mission profiling may be an on-line process, using all the information available to the platform and any extra information (for instance, customers, designs, versioning, etc.) that can be collected. Proper analysis can generate full graphs to facilitate guard-bands for different usages and thus optimize the use of material. Systematic shifts, for example, may be identifiable as an unexpected parametric shift in the testing conditions.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

In the description and claims of the application, each of the words "comprise" "include" and "have", and forms thereof, are not necessarily limited to members in a list with which the words may be associated. In addition, where there are inconsistencies between this application and any document incorporated by reference, it is hereby intended that the present application controls.

To clarify the references in this disclosure, it is noted that the use of nouns as common nouns, proper nouns, named nouns, and the/or like is not intended to imply that embodiments of the invention are limited to a single embodiment, and many configurations of the disclosed components can be used to describe some embodiments of the invention, while other configurations may be derived from these embodiments in different configurations.

In the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming but would nevertheless be a routine undertaking of engineering for those of ordinary skill in the art having the benefit of this disclosure.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Moreover, the various features and embodiments of the invention described above are specifically contemplated to be used alone as well as in various combinations.

Conventional and/or contemporary circuit design and layout tools may be used to implement the invention. The specific embodiments described herein, and in particular the various thicknesses and compositions of various layers, are illustrative of exemplary embodiments, and should not be viewed as limiting the invention to such specific implementation choices. Accordingly, plural instances may be provided for components described herein as a single instance.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings (which may be termed programs) and representations of same, whether embodied in media or combined with suitable reader facilities to allow fabrication, test, or design refinement of the corresponding circuits and/or structures. Structures and functionality presented as discrete components in the exemplary configurations may be implemented as a combined structure or component. The invention is contemplated to include circuits, systems of circuits, related methods, and computer-readable (medium) encodings of such circuits, systems, and methods, all as described herein, and as defined in the appended claims. As used herein, a computer readable medium includes at least disk, tape, or other magnetic, optical, semiconductor (e.g., flash memory cards, ROM), or electronic medium and a network, wireline, wireless or other communications medium.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, which are intended to define the scope of this invention. In particular, even though the preferred embodiments are described in the context of a memory IC, the teachings of the present invention are believed advantageous for use with other types of semiconductor IC using I/O circuitry. Moreover, the techniques described herein may also be applied to other types of circuit applications. Accordingly, other variations, modifications, additions, and improvements may fall within the scope of the invention as defined in the claims that follow.

Although one or more interposers are discussed above, it will be understood that other types of interconnect are possible, for example an interconnect bridge. One such bridge is an embedded multi-die interconnect bridge (EMIB) as marketed by Intel Corporation.

Embodiments of the present invention may be used to fabricate, produce, and/or assemble integrated circuits and/or products based on integrated circuits.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

What is claimed is:

1. An input/output (I/O) block for a semiconductor integrated circuit (IC), the I/O block comprising:
   at least one I/O buffer, configured to define at least one signal path in respect of a connection to a remote I/O block via a communication channel, each signal path causing a respective signal edge slope; and
   an I/O sensor coupled to the at least one signal path and configured to generate an output signal indicative of at least one of:
      (a) a timing difference between: the signal edge slope for a first signal path of the at least one signal path, and the signal edge slope for a second, distinct signal path of the at least one signal path, and
      (b) an eye pattern parameter for one or more of the at least one signal path.

2. The I/O block of claim 1, wherein;
   the least one I/O buffer comprises a transmission buffer,
   the first signal path is coupled to an output of the transmission buffer that is coupled to the communication channel,
   the first signal path being further coupled to the remote I/O block via a first connection bump, and
   the output signal of the I/O sensor being further indicative of a quality of the first connection bump.

3. The I/O block of claim 2, wherein:
   the least one I/O buffer is configured to use differential signaling across the communication channel,
   the transmission buffer is configured to produce two differential outputs,
   the first signal path is coupled to a first differential output of the two differential outputs;
   the second signal path is: coupled to the remote I/O block via a second connection bump, and coupled to a second differential output of the two differential outputs, and
   the output signal of the I/O sensor being further indicative of a quality of the second connection bump.

4. The I/O block of claim 2, wherein the at least one signal path comprises at least one of:
   (a) a signal path that is coupled to an input of the transmission buffer; and
   (b) a signal path that is coupled to the remote I/O block via an interconnect and a connection bump between the transmission buffer and the interconnect,
   wherein the output signal of the I/O sensor being further indicative of a quality of the first connection bump.

5. The I/O block of claim 1, further comprising:
   a differential buffer, configured to output a difference between a differential buffer input signal, received on a path coupled to the communication channel, and a fixed level signal,
   wherein a signal path of the at least one signal path is coupled to the output of the differential buffer.

6. The I/O block of claim 5, wherein the fixed level signal is a voltage fixed at a predetermined proportion of a DC power supply voltage for the IC, optionally wherein:
   the predetermined proportion is dynamically adjusted; or
   the predetermined proportion is 75%.

7. The I/O block of claim 1, wherein the at least one I/O buffer comprises a reception buffer having an input that is coupled to the communication channel, a signal path of the at least one signal path being coupled to an output of the reception buffer.

8. The I/O block of claim 7, wherein the input to the reception buffer is coupled to the remote I/O block via an interconnect and a connection bump between the interconnect and remote I/O block, the output signal of the I/O sensor being further indicative of a quality of the connection bump.

9. The I/O block of claim 1, wherein the communication channel is configured to carry a differential signal via two signal lines, a first signal path of the at least one signal path being coupled to a first signal line and a second signal path of the at least one signal path being coupled to a second signal line.

10. The I/O block of claim 1, wherein the I/O sensor comprises:
    a first input port;
    a second input port;
    a third input port coupled to a second signal path; and
    a selector, configured to couple the first signal path to either the first input port or the second input port in response to a received selection signal, such that the output signal of the I/O sensor is selectively indicative of a timing difference between (a) the signal edge for the second signal path, and (b) the signal edge for the first signal path either through the first input port or through the second input port.

11. The I/O block of claim 1, wherein the eye pattern parameter comprises one or more of: eye width; eye height; eye width jitter; and eye height fluctuation.

12. The I/O block of claim 1, wherein the output signal comprises a pulse having a width indicative of: a timing difference between the signal edge for the first signal path and the signal edge for the second signal path; or the eye pattern parameter.

13. The I/O block of claim 1, further comprising at least one of:
    a performance optimizer configured to adjust a parameter of the at least one I/O buffer based on the output signal of the I/O sensor; and
    a repair controller configured to adjust a configuration of the I/O buffer based on the output signal of the I/O sensor.

14. The I/O block of claim 13, wherein the repair controller is configured, in response to the output signal of the I/O sensor, to perform at least one of:
    disable a part or a whole of the IC;
    cause a lane remapping of at least part of the IC; and
    adjust a transmission buffer strength within the IC, based on at least one of: an instantaneous temperature of the IC, and voltage of the IC.

15. The I/O block of claim 1, further comprising:
    a time-to-digital converter, configured to receive a timing signal derived from the output signal of the I/O sensor and to provide a digital time signal based on the timing signal.

16. A semiconductor integrated circuit (IC), comprising the I/O block of claim 1.

17. The semiconductor IC of claim 16, wherein the I/O sensor is configured to communicate the output signal externally of the semiconductor IC.

18. The semiconductor IC of claim 16, further comprising:
- a filtered counter block, configured to,
  - receive a time signal based on the output signal of the I/O sensor,
  - compare the received time signal against a threshold, and
  - based on the comparison, identify exceptional or outlier readouts from the I/O sensor.

19. The semiconductor IC of claim 18, wherein the filtered counter block is further configured to count at least one number of: a normal readouts from the I/O sensor, and a number of exceptional or outlier readouts from the I/O sensor.

20. A semiconductor IC system, comprising the semiconductor IC of claim 16 and further comprising at least one of:
- an I/O profiling part, configured to generate at least one of an I/O profile and an I/O classification, based on the output signal of the I/O sensor; and
- an Embedded Virtual Scope (EVS) part, configured to measure at least one of a signal amplitude and a signal slew-rate for a pin of the semiconductor IC, based on the output signal of the I/O sensor.

21. The semiconductor IC system of claim 20, wherein the I/O profiling part is further configured to perform at least one of:
- compare at least one of the I/O profile and the classification with family data for the semiconductor IC;
- detect a systematic shift based on at least one of the I/O profile and the classification; and
- detect outliers based on tester data.

* * * * *